United States Patent
Fukase et al.

(10) Patent No.: US 9,293,724 B2
(45) Date of Patent: Mar. 22, 2016

(54) LIGHT-EMITTING ELEMENT, LIGHT-EMITTING DEVICE, DISPLAY DEVICE, AND ELECTRONIC APPARATUS

(71) Applicant: SEIKO EPSON CORPORATION, Tokyo (JP)

(72) Inventors: Akio Fukase, Chino (JP); Hidetoshi Yamamoto, Suwa (JP); Yuki Hanamura, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/643,716

(22) Filed: Mar. 10, 2015

(65) Prior Publication Data
US 2015/0287948 A1 Oct. 8, 2015

(30) Foreign Application Priority Data
Apr. 4, 2014 (JP) .................. 2014-078253

(51) Int. Cl.
*H01L 51/50* (2006.01)
*H01L 51/00* (2006.01)

(52) U.S. Cl.
CPC ............ *H01L 51/504* (2013.01); *H01L 51/006* (2013.01); *H01L 51/0056* (2013.01); *H01L 51/0058* (2013.01); *H01L 51/0059* (2013.01); *H01L 51/0072* (2013.01); *H01L 51/5056* (2013.01); *H01L 51/5072* (2013.01)

(58) Field of Classification Search
CPC .............. H01L 51/504; H01L 51/5056; H01L 51/5072; H01L 51/0059
See application file for complete search history.

(56) References Cited

U.S. PATENT DOCUMENTS

| 2006/0227079 | A1 | 10/2006 | Kashiwabara | |
|---|---|---|---|---|
| 2009/0079335 | A1 | 3/2009 | Mitsuya et al. | |
| 2009/0146552 | A1* | 6/2009 | Spindler | H01L 51/5036 313/504 |
| 2009/0294778 | A1* | 12/2009 | Mitsuya | H01L 51/5036 257/79 |

(Continued)

FOREIGN PATENT DOCUMENTS

| JP | 2005100921 A | 4/2005 |
|---|---|---|
| JP | 2008294356 A | 12/2008 |

(Continued)

*Primary Examiner* — Mamadou Diallo
(74) *Attorney, Agent, or Firm* — Oliff PLC

(57) ABSTRACT

Disclosed herein is a light-emitting element, including: a cathode; an anode; and a light-emitting unit, in which the light-emitting unit includes a first light-emitting layer, an intermediate layer, a second light-emitting layer, and a third light-emitting layer, which are laminated from the anode side to the cathode side, in which each of the second and third light-emitting layers is configured to contain a luminescent material, a host material, and an assist dopant material, in which the intermediate layer is configured to contain the host material and the assist dopant material, and in which, when the concentrations of the assist dopant materials contained in the second light-emitting layer, the third light-emitting layer, and the intermediate layer are respectively expressed by $C_{Assist}(EML2)$, $C_{Assist}(EML3)$, and $C_{Assist}(IML)$, the following Relational Expression (A) is satisfied:

$$C_{Assist}(IML) > C_{Assist}(EML2) \geq C_{Assist}(EML3) \quad (A).$$

20 Claims, 4 Drawing Sheets

(56) References Cited

U.S. PATENT DOCUMENTS

| | | | |
|---|---|---|---|
| 2015/0060776 A1* | 3/2015 | Chang | H01L 51/504 257/40 |
| 2015/0311452 A1* | 10/2015 | Yoshida | C07D 405/10 257/40 |

FOREIGN PATENT DOCUMENTS

| | | |
|---|---|---|
| JP | 2009076793 A | 4/2009 |
| JP | 2011258588 A | 12/2011 |

* cited by examiner

LIGHT-EMITTING ELEMENT, LIGHT-EMITTING DEVICE, DISPLAY DEVICE, AND ELECTRONIC APPARATUS

BACKGROUND

1. Technical Field

The present invention relates to a light-emitting element, a light-emitting device, a display device, and an electronic apparatus.

2. Related Art

An organic electroluminescence element (so-called organic EL element) is a light-emitting element having a structure in which a luminescent organic layer of at least one layer is interposed between an anode and a cathode. In such a light-emitting element, when an electric field is applied between a cathode and an anode, electrons are injected into a light-emitting layer from the cathode and holes are injected into the light-emitting layer from the anode, and thus the electrons and holes are recombined in the light-emitting layer, that is, carriers are recombined to generate excitons. When these excitons return to a ground state, the energy content is emitted as light.

Such an organic El element is thin and lightweight, and is thus proposed to be applied to various illuminations and thin displays.

Here, in illumination applications, since it is necessary to emit white light containing RGB light (three primary colors of light), it is required to use a white light-emitting organic EL element provided with a plurality of different light-emitting layers responsible for emission of each color of RGB in one organic EL element.

Meanwhile, in display applications, in order to obtain an RGB light emission for each pixel, a method of forming organic EL elements having different structures and respectively emitting RGB by patterning is used. However, this method is problematic in that it is difficult to manufacture a fine mask for patterning a light-emitting layer including an organic EL element, and it is difficult to perform a position alignment in the process of manufacturing an organic EL panel. Therefore, it is difficult to realize this method.

For this reason, even in display applications, similar to illumination applications, a white light-emitting organic EL element provided with a plurality of different light-emitting layers responsible for emission of each color of RGB in one organic El element is widely used. In this case, a method of extracting an RGB emission by uniformly forming white light-emitting organic EL elements on a substrate and changing the optical path length around the substrate with respect to each RGB to form different optical resonator structures or to form color filters is used.

As such, when the respective light-emitting layers of RGB are embedded in one organic EL element, it is required to obtain well-balanced light emission from all the RGB light-emitting layers, and it is required to devise a carrier transporting layer made of an emission host material or an intermediate layer provided between light-emitting layers.

For example, JP-A-2005-100921 discloses a light-emitting element for obtaining white light emission, in which a hole transporting layer, a red light-emitting layer, a green light-emitting layer, an intermediate layer, a blue light-emitting layer, and an electron transporting layer are sequentially laminated from an anode side toward a cathode side.

However, in this light-emitting element having such a configuration, the host material used in the blue light-emitting layer has high electron transportability, and thus the recombination regions of electrons and holes are concentrated in the vicinity of the interface between the intermediate layer and the blue light-emitting layer. Therefore, when an electric current is continuously applied, there is a problem in that degradation of the blue light-emitting layer remarkably progresses.

SUMMARY

An advantage of some aspects of the invention is to provide a light-emitting element having excellent luminescence characteristics and lifetime characteristics maintaining such luminescence characteristics over a long period of time, a light-emitting device including the light-emitting element and having excellent reliability, a display device, and an electronic apparatus.

The invention is realized in the following forms.

According to an aspect of the invention, there is provided a light-emitting element, including: a cathode; an anode; and a light-emitting unit provided between the cathode and the anode to emit light when a driving voltage is applied, in which the light-emitting unit includes a first light-emitting layer emitting first light, an intermediate layer, a second light-emitting layer emitting second light having a different color from the first light, and a third light-emitting layer emitting third light having a different color from the first light, which are laminated from the anode side to the cathode side, in which each of the second and third light-emitting layers is configured to contain a luminescent material, a host material, and an assist dopant material, in which the intermediate layer is configured to contain the host material and the assist dopant material, in which one of the host material and the assist dopant material is material having high electron transportability, and the other thereof is a material having high hole transportability, and in which, when the concentrations of the assist dopant materials contained in the second light-emitting layer, the third light-emitting layer, and the intermediate layer are respectively expressed by $C_{Assist}(EML2)$, $C_{Assist}(EML3)$, and $C_{Assist}(IML)$, the following Relational Expression (A) is satisfied:

$$C_{Assist}(IML) > C_{Assist}(EML2) \geq C_{Assist}(EML3) \quad (A).$$

Thus, it is possible to obtain a light-emitting element having excellent luminescence characteristics and lifetime characteristics maintaining such luminescence characteristics over a long period of time.

In the light-emitting element, the host material may be a material having high electron transportability, and the assist dopant material may be a material having high hole transportability.

In the light-emitting element, in each of the second and third light-emitting layers and the intermediate layer, when mobility of holes is expressed by $\mu h$ and mobility of electrons is expressed by $\mu e$, in the intermediate layer and the second light-emitting layer, the following Relational Expression (1) may be satisfied:

$$0.01 \leq \mu e/\mu h \leq 100 \quad (1).$$

Thus, in the intermediate layer and the second light-emitting layer, it is possible to transfer holes and electrons with good balance. Therefore, the position where carriers are recombined (recombination site) can be spaced sufficiently from the vicinity of the interface between the anode side and the second light-emitting layer, and this recombination site can be reliably spread over the second light-emitting layer.

In the light-emitting element, in the third light-emitting layer, the following Relational Expression (2) may be satisfied:

$$\mu e/\mu h \geq 100 \quad (2).$$

Thus, in the third light-emitting layer, it is possible to more reliably suppress or prevent the holes having passed through the second light-emitting layer from passing through the third light-emitting layer and then reaching the cathode side compared to the third green light-emitting layer.

In the light-emitting element, when the thicknesses of the second and third light-emitting layers are respectively expressed by T(EML2) and T(EML3), the following Relational Expression (B) may be satisfied:

$$T(EML2) \leq T(EML3) \quad (B).$$

Thus, it is possible for the third light-emitting layer to more reliably exhibit function as a block layer suppressing or preventing the passage of holes toward the cathode side compared to the third light-emitting layer.

In the light-emitting element, the host material may be an acene-based compound.

Since the acene-based compound is a host material having high electron transportability, it is suitably used as the host material of the light-emitting layer required to easily supply electrons to the anode side.

In the light-emitting element, the assist dopant material may be an amine-based compound.

Thus, the concentration of the assist dopant material can easily be set to concentration satisfying the above Relational Expression (A).

In the light-emitting element, the amine-based compound may be a compound represented by the following Formula (4).

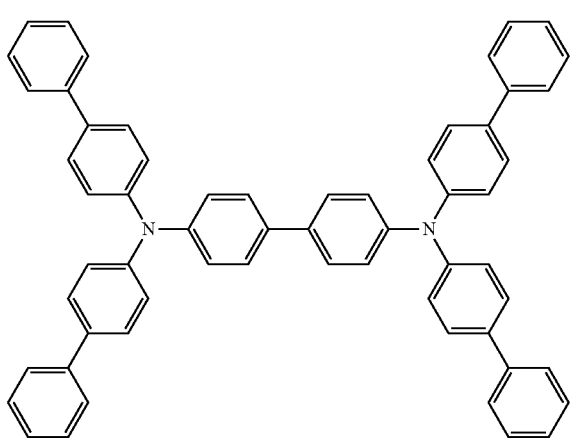

(4)

Thus, the concentration of the assist dopant material can easily be set to concentration satisfying the above Relational Expression (A).

In the light-emitting element, the luminescent materials respectively contained in the second light-emitting layer and the third light-emitting layer may be the same as each other.

Thus, the second light-emitting layer and the third light-emitting layer can constitute a light-emitting element that emits light of the same color.

In the light-emitting element, the luminescent materials respectively contained in the second light-emitting layer and the third light-emitting layer may be different from each other.

Thus, the second light-emitting layer and the third light-emitting layer can constitute a light-emitting element that emits light of different color.

According to another aspect of the invention, there is provided a light-emitting device including the light-emitting element.

Thus, it is possible to provide a light-emitting device having excellent lifetime characteristics.

According to still another aspect of the invention, there is provided a display device including the light-emitting device.

Thus, it is possible to provide a display device having excellent lifetime characteristics.

According to still another aspect of the invention, there is provided an electronic apparatus including the display device.

Thus, it is possible to provide an electronic apparatus having excellent lifetime characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of a light-emitting element, a light-emitting device, a display device, and an electronic apparatus of the invention will be described with reference to the accompanying drawings.

Figure 1:
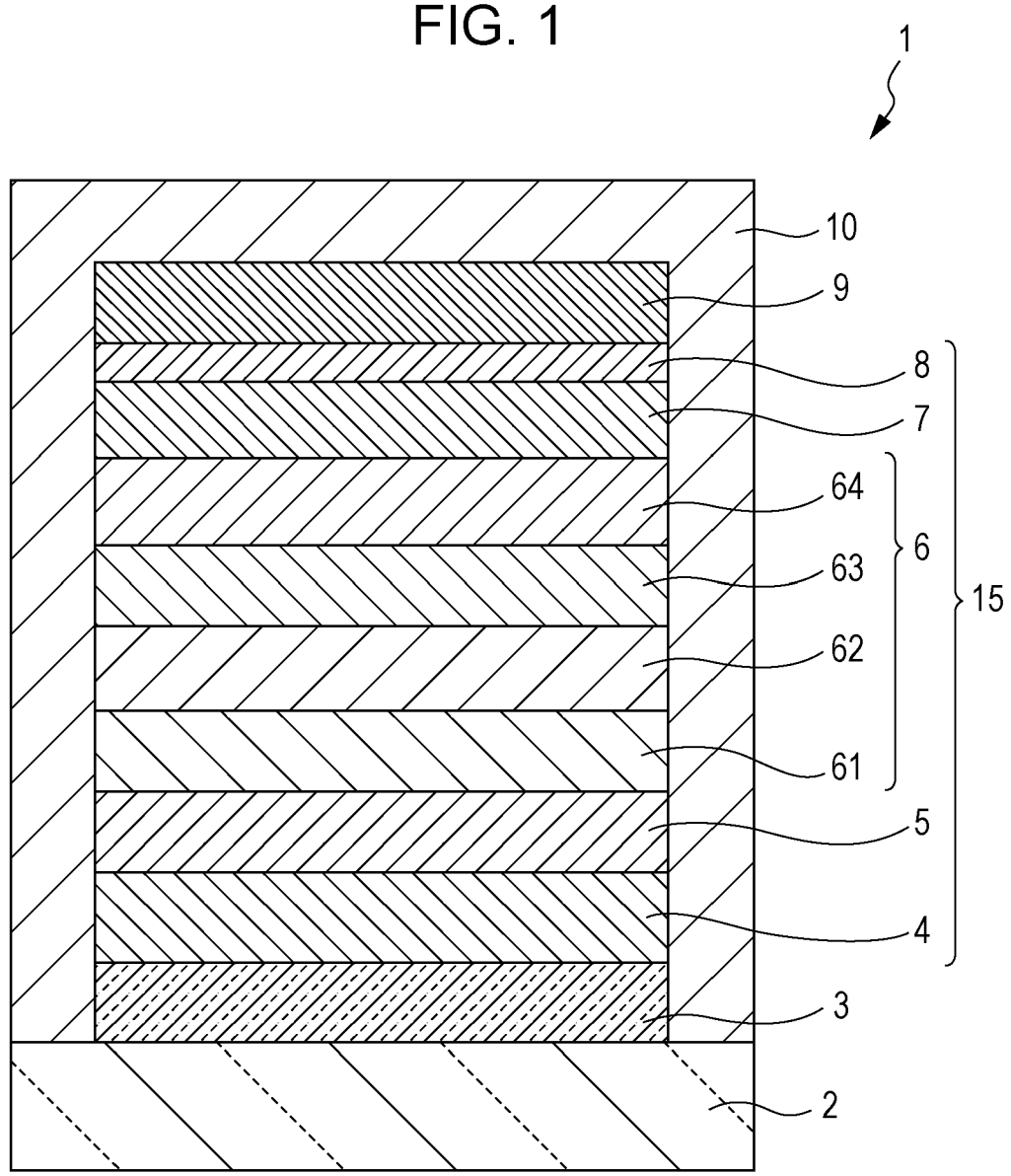
FIG. 1 is a schematic longitudinal sectional view showing an embodiment of the light-emitting element of the invention.

First, a light-emitting element (organic electroluminescence element) 1 of the invention will be described. FIG. 1 is a schematic longitudinal sectional view showing an embodiment of the light-emitting element of the invention. Hereinafter, for convenience of description, in FIG. 1, an upper side is represented as "on", and a lower side is represented as "beneath".

The light-emitting element (electroluminescence element) 11 shown in FIG. 1 is an organic light-emitting element (white light-emitting element) that emits light of white color as an emission color by allowing several kinds of organic luminescent materials to emit red light (R), green light (G), and blue light (B).

Such a light-emitting element 1 is configured such that an anode 3, a hole injection layer 4, a hole transporting layer 5, a light-emitting unit 6 composed of a plurality of light-emitting layers, an electron transporting layer 7, an electron injection layer 8, and a cathode 9 are sequentially laminated. Here, the light-emitting unit 6 is a laminate in which a red light-emitting layer (first light-emitting layer) 61, an intermediate layer 62, a blue light-emitting layer (second light-emitting layer) 63, and a green light-emitting layer (third light-emitting layer) 64 are sequentially laminated from the anode 3 side to the cathode 9 side.

Further, the entire light-emitting element 1 is provided on a substrate 2, and is sealed with a sealing member 10.

In this light-emitting element 1, when a driving voltage is applied to the anode 3 and the cathode 9 side, electrons are supplied (injected) from the cathode 9 to the red light-emitting layer 61, the blue light-emitting layer 63 and the green light-emitting layer 64, and holes are supplied (injected) from the anode 3 side thereto. And, in each of the light-emitting layers, holes and electrons are recombined the energy generated by the recombination thereof generates excitons, and these excitons return to a ground state to generate (emit) energy (fluorescence or phosphorescence). Therefore, the light-emitting element 1 emits white light.

The substrate 2 serves to support the anode 3. Since the light-emitting element 1 of the present embodiment ((bottom emission type) is configured to extract light from the substrate 2 side, each of the substrate and the anode 3 is substantially transparent (colorless and transparent, colored transparent, or translucent).

Examples of the constituent material of the substrate 2 include resin materials, such as polyethylene terephthalate, polyethylene naphthalate, polypropylene, a cycloolefin polymer, polyamide, polyether sulfone, polymethyl methacrylate, polycarbonate, and polyarylate; and glass materials, such as quartz glass and soda glass. They can be used alone or in a combination of two or more thereof.

The average thickness of this substrate 2 is not particularly limited, but is preferably about 0.1 mm to 30 mm, and more preferably about 0.1 mm to 10 mm.

Meanwhile, when the light-emitting element 1 (top emission type) is configured to extract light from a side opposite to the substrate 2, either a transparent substrate or an opaque substrate can be used as the substrate 2.

Examples of the opaque substrate include a substrate made of a ceramic material such as alumina, a substrate which is made of a metal such as stainless steel and on which an oxide film (insulation film) is provided, a substrate made of a resin material, and the like.

Hereinafter, each unit constituting the light-emitting element 1 will be sequentially described.

Anode

The anode 3 is an electrode serving to inject holes into the hole transporting layer 5 through the hole injection layer 4 to be described later. As the constituent material of the anode 3, a material having a high work function and excellent conductivity is preferably used.

Examples of the constituent material of the anode 3 include oxides, such as indium tin oxide (ITO), indium zinc oxide (IZO), $In_2O_3$, $SnO_2$, Sb-containing $SnO_2$, and Al-containing ZnO; and Au, Pt, Ag, Cu, and alloys thereof. They can be used alone or in a combination of two or more thereof.

The average thickness of this anode 3 is not particularly limited, but is preferably about 10 nm to 200 nm, and more preferably about 50 nm to 150 nm.

Cathode

On the other hand, the cathode 9 is an electrode serving to inject electrons into the electron transporting layer 7 through the electron injection layer 8 to be described later. As the constituent material of the cathode 9, a material having a low work function is preferably used.

Examples of the constituent material of the cathode 9 include Li, Mg, Ca, Sr, La, Ce, Er, Eu, Sc, Y, Yb, Ag, Cu, Al, Cs, Rb, and alloys thereof. They can be used alone or in a combination of two or more thereof (for example, a laminate of a plurality of layers).

Particularly, when an alloy is used as the constituent material of the cathode 9, an alloy containing a stable metal element such as Ag, Al or Cu, specifically, an alloy such as MgAg, AlLi, or CuLi is preferably used. When such an alloy is used as the constituent material of the cathode 9, it is possible to improve the electron injection efficiency and stability of the cathode 9.

The average thickness of this cathode 9 is not particularly limited, but is preferably about 100 nm to 10000 nm, and more preferably about 100 nm to 500 nm.

Since the light-emitting element 1 of the present embodiment is a bottom emission type light-emitting element, the cathode 9 is not particularly required to have optical transparency.

Hole Injection Layer

The hole injection layer 4 is a layer having a function of improving a hole injection efficiency from the anode 3 (that is, having hole injection properties).

This hole injection layer 4 contains a material having hole injection properties (that is, a hole injecting material).

The hole injecting material is not particularly limited, but examples thereof include copper phthalocyanine, 4,4',4"-tris(N,N-phenyl-3-methylphenylamino)triphenylamine (m-MT-DATA), and N,N'-bis-(4-diphenylamino-phenyl)-N,N'-diphenyl-biphenyl-4-4'-diamine represented by the following Formula (1).

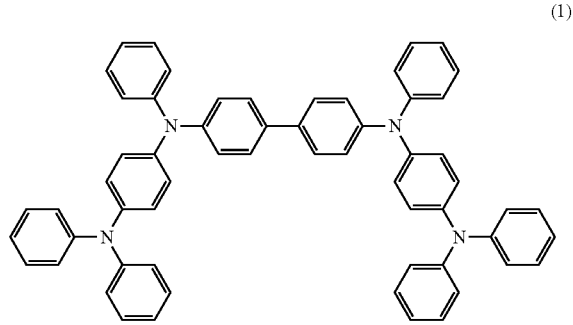 [SMILES: c1ccc(N(c2ccccc2)c2ccc(N(c3ccccc3)c3ccc(-c4ccc(N(c5ccccc5)c5ccc(N(c6ccccc6)c6ccccc6)cc5)cc4)cc3)cc2)cc1]

(1)

Among them, from the viewpoint of excellent hole injection properties, an amine-based compound is preferably used as the hole injecting material.

The average thickness of this hole injection layer 4 is not particularly limited, but is preferably 1 nm to 100 nm, and more preferably 1 nm to 80 nm. Therefore, it is possible to make the driving voltage of the light-emitting element 1 lower.

Meanwhile, this hole injection layer 4 may be omitted by the combination of the constituent materials contained in the anode 3 and the hole transport layer 5.

Hole Transporting Layer

The hole transporting layer 5 is provided in contact with the hole injection layer 4, and has a function of transporting the holes injected from the anode 3 through the hole injection layer 4 to the red light-emitting layer 61. As the constituent material of the hole transporting layer 5, various p-type polymer material and various p-type low-molecular materials can be used alone or in a combination thereof. For example, an amine-based compound having amine in its chemical structure can be used.

The amine-based compound is a material capable of suitably extracting electrons by the hole injecting material and easily injecting holes. Therefore, when the amine-based compound is used as the constituent material of the hole transporting layer 5, holes can be suitably injected from the anode 3 through the hole injection layer 4, and the light-emitting element 1 can be suitably driven even at a lower voltage.

Examples of the amine-based compound include N,N'-di(1-naphthyl)-N,N'-diphenyl-1,1'-biphenyl-4,4'-diamine (α-NPD) represented by the following Formula (2), N,N'-diphenyl-N,N'-bis(3-methylphenyl)-1,1'-biphenyl-4,4'-diamine (TPD), a compound represented by the following Formula (3), a tetraarylbenzidine derivative such as a compound represented by the following Formula (4), and a tetraaryl diaminofluorene compound or a derivative thereof. They can be used alone or in a combination of two or more thereof.

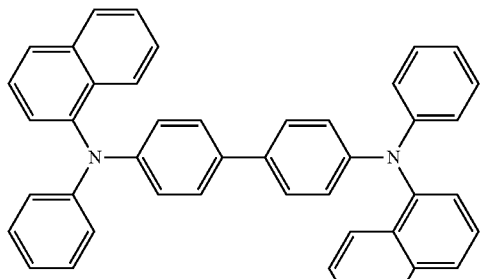

(2)

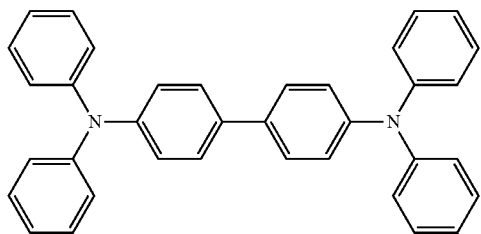

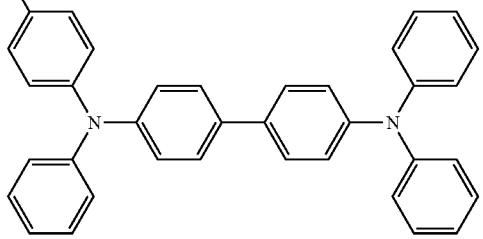

(3)

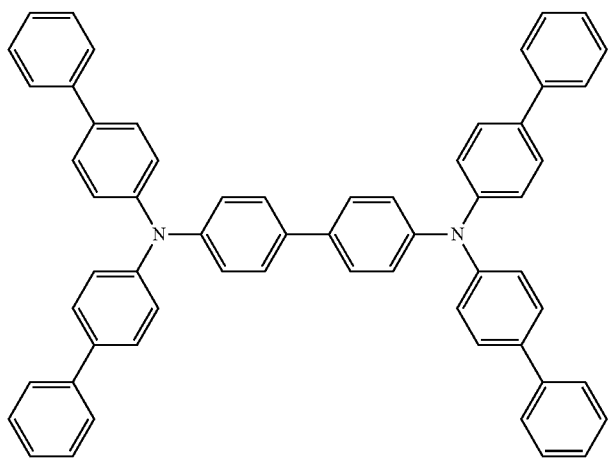

(4)

Particularly, among them, as the amine-based compound, N,N'-di(1-naphthyl)-N,N'-diphenyl-1,1'-biphenyl-4,4'-diamine (α-NPD) represented by the above Formula (2) is preferably used. Since this compound can more suitably extract electrons by the hole injecting material, and, particularly, easily inject holes, the light-emitting element 1 can be suitably driven even at a lower voltage.

The average thickness of this hole transporting layer 5 is not particularly limited, but is preferably 10 nm to 150 nm, and more preferably 10 nm to 100 nm.

Meanwhile, this hole transporting layer 5 may be omitted by the combination of the constituent materials contained in the hole injection layer 4 and the red light-emitting layer 61.

Light-Emitting Unit

As described above, the light-emitting unit 6 is an laminate in which the red light-emitting layer (first light-emitting layer) 61, the intermediate layer 62, the blue light-emitting layer (second light-emitting layer) 63, and the green light-emitting layer (third light-emitting layer) 64 are sequentially laminated from the anode 3 side.

Hereinafter, these light-emitting layers will be sequentially described, respectively. In the present embodiment, the red light-emitting layer (first light-emitting layer) 61 emitting red light, the blue light-emitting layer (second light-emitting layer) 63 emitting blue light, and the green light-emitting layer (third light-emitting layer) 64 emitting green light constitutes the first to third light-emitting layers of the light emitting element of the invention.

Red Light-Emitting Layer

In the present embodiment, the red light-emitting layer (first light-emitting layer) 61 is configured to contain a red luminescent material (first luminescent material) emitting red light (first color light) and a host material (first host material) supporting the red luminescent material.

Such a red luminescent material is not particularly limited. As the red luminescent material, various red fluorescent materials and red phosphorescent materials can be used alone or in a combination of two or more thereof.

The red fluorescent material is not particularly limited as long as it emits red fluorescence, end, examples thereof include a perylene derivative represented by the following formula (5) such as a tetraaryl diindenoperylene derivative, a europium complex, a benzopyran derivative, a rhodamine derivative, a benzothioxanthene derivative, a porphyrin derivative, Nile Red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene)propanedinitrile (DCJTB), 4-(dicyanomethylene)-2-methyl-6-(p-dimethylaminostyryl)-4H-pyran (DCM), and the like.

(5)

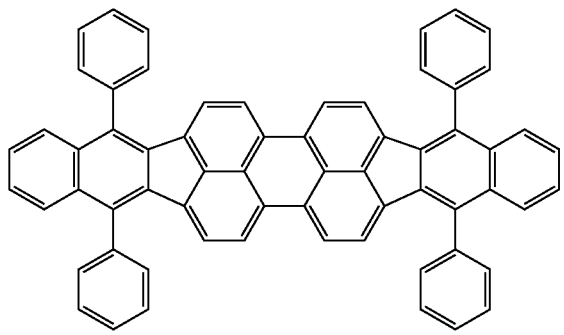

The red phosphorescent material is not particularly limited as long as it emits red phosphorescence, and, examples thereof include metal complexes such as an iridium complex, a ruthenium complex, a platinum complex, an osmium complex, a rhenium complex, and a palladium complex. At least one of ligands of this metal complex has a phenyl pyridine skeleton, a bipyridyl skeleton, a porphyrin skeleton, or the like. Specific examples thereof include tris(1-phenylisoquinoline)iridium, bis[2-(2'-benzo[4,5-α]thienyl)pyridinate-N,C³']iridium(acetylacetonate) (btp2Ir(acac)), 2,3,7,8,12,13,17,18-octaethyl-12H,23H-porphyrin-platinum(II), bis[2-(2'-benzo[4,5-α]thienyl)pyridinate-N,C³']iridium, and bis(2-phenylpyridine)iridium(acetylacetonate).

Meanwhile, as the constituent material of the red light-emitting layer 61, a host material (first host material) using this red luminescent material as a guest material is included in addition to the red luminescent material (luminescent material). This host material recombines holes and electrons to generate exitons, and simultaneously transfers (Forster-transfers or Dexter-transfers) energy of the excitons to the red luminescent material to have a function of exciting the red luminescent material. For example, such a host material is doped with the red luminescent material (guest material) as a luminescent dopant, and is then used.

This first host material is not particularly limited as long as it exhibits the above-mentioned function for the red luminescent material to be used, but examples thereof, when the red luminescent material contains the red fluorescent material, include acene derivatives (acene-based compounds), such as an anthracene derivative represented by the following Formula (6), an anthracene derivative such as 2-t-butyl-9,10-di(2-naphthyl)anthracene (TBADN), and an naphthacene derivative represented by the following Formula (7); a distyrylarylene derivative; a perylene derivative; a distyrylbenzene derivative; a distyrylamine derivative; a quinolinolate-based metal complex such as a tris(8-quinolinolato) aluminum complex (Alq3); a triarylamine derivative such as a tetramer of triphenylamine; an oxadiazole derivative; a silole derivative; a dicarbazole derivative; an oligothiophene derivative; a benzopyran derivative; a triazole derivative; a benzoxazole derivative; a benzothiazole derivative; a quinoline derivative; and 4,4'-bis(2,2'-diphenyl vinyl)biphenyl (DPVBi). They can be used alone or in a combination of two or more thereof.

Further, when the red luminescent material contains the red phosphorescent material, examples of the first host material include carbazole derivatives such as 3-phenyl-4-(1'-naphthyl)-5-phenylcarbazole, and 4,4'-N,N'-dicarbazole-biphenyl (CBP). They can be used alone or in a combination of two or more thereof.

(6)

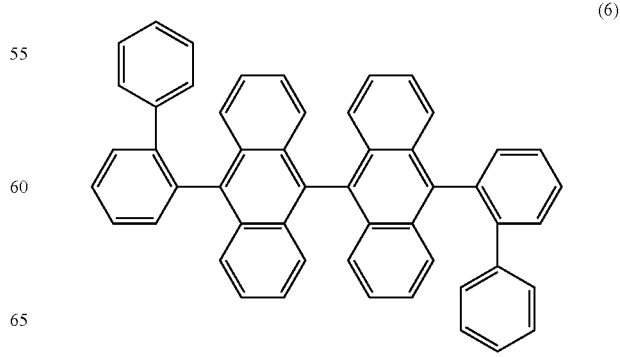

(7)

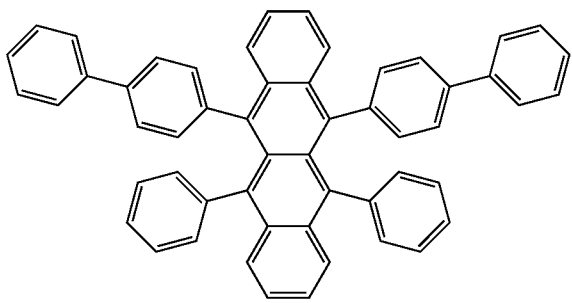

The content (doping amount) of the red luminescent material in the red light-emitting layer 61 is preferably 0.01 wt % to 10 wt %, and more preferably 0.1 wt % to 5 wt %. When the content of the red luminescent material is within the above range, it is possible to optimize a luminous efficiency, and it is possible to allow the red light-emitting layer 61 to emit light while adjusting the balance of the luminescence amount between the red light-emitting layer 61 and the following blue light-emitting layer 63 or green light-emitting layer 64.

The average thickness of the red light-emitting layer 61 is not particularly limited, but is preferably about 1 nm to 20 nm, and more preferably about 3 nm to 10 nm.

Intermediate Layer

The intermediate layer 62 is provided between the above-mentioned red light-emitting layer 61 and the following blue light-emitting layer 63 so as to be in contact with these layers 61 and 63. In addition, this intermediate layer 62 has a function of adjusting the amount of electrons transported from the blue light-emitting layer 63 to the red light-emitting layer 61. Further, the intermediate layer 62 has a function of adjusting the amount of holes transported from the red light-emitting layer 61 to the blue light-emitting layer 63. That is, the intermediate layer 62 functions as a non-emissive carrier transporting layer for adjusting the amount of carriers transported between the blue light-emitting layer 63 and the red light-emitting layer 61. As a result, the intermediate layer 62 has a function of preventing the energy of excitons from being transferred between the red light-emitting layer 61 and the blue light-emitting layer 63. Thanks to this function, it is possible to allow each of the red light-emitting layer 61 and the blue light-emitting layer 63 to efficiently emit light. As a result, it is possible to allow each of the light-emitting layer to emit light in a well-balanced manner, and thus the light-emitting element 1 can emit light of a desired color (white in the present embodiment), and the luminous efficiency and emission lifetime of the light-emitting element 1 can be improved.

The constituent material of this intermediate layer 62 is not particularly limited as long as the intermediate layer 62 can exhibit the above-mentioned function, but, in the invention, a constituent material containing both the host material contained in the first to third light-emitting layers and the assist dopant material contained in the second and third light-emitting layers is used.

As the host material (fourth host material), a host material which is the same as the above-described first host material of the red light-emitting layer 61 can be used. Further, as the assist dopant material (fourth assist dopant material), an assist dopant material which is the same as the above-described second assist dopant material of the blue light-emitting layer 63 can be used.

The average thickness of the intermediate layer 62 is not particularly limited, but is preferably about 5 nm to 50 nm, and more preferably about 10 nm to 30 nm.

Blue Light-Emitting Layer

In the present embodiment, the blue light-emitting layer (second light-emitting layer) 63 emits light of blue color (second color) different from red color (first color), and is configured to contain a blue luminescent material (second luminescent material) emitting light of blue color (second color), a host material (second host material) supporting the blue luminescent material, and an assist dopant material (second assist dopant material) having mobility opposite to this host material.

The blue luminescent material is not particularly limited. As the blue luminescent material, various blue fluorescent materials and blue phosphorescent materials can be used alone or in a combination of two or more thereof.

The blue fluorescent material is not particularly limited as long as it emits blue fluorescence, but examples thereof include a distyrylamine derivative such as a distyryldiamine-based compound represented by the following Formula (8), a fluoranthene derivative, a pyrene derivative, perylene and perylene derivative, an anthracene derivative, a benzoxazole derivative, a benzothiazole derivative, a benzimidazole derivative, a chrysene derivative, a phenanthrene derivative, a distyrylbenzene derivative, tetraphenyl butadiene, 4,4'-bis(9-ethyl-3-carbazovinylene)-1,1'-biphenyl (BCzVBi), poly[(9.9-dioctylfluorene-2,7-diyl)-co-(2,5-dimethoxybenzene-1,4-diyl)], poly[(9,9-di-hexyloxyfluorene-2,7-diyl)-ortho-co-(2-methoxy-5-{2-ethoxyhexyloxy}phenylene-1,4-diyl)], and poly[(9,9-dioctylfluorene-2,7-diyl)-co-(ethynyl benzene)]. They can be used alone or in a combination of two or more thereof.

(8)

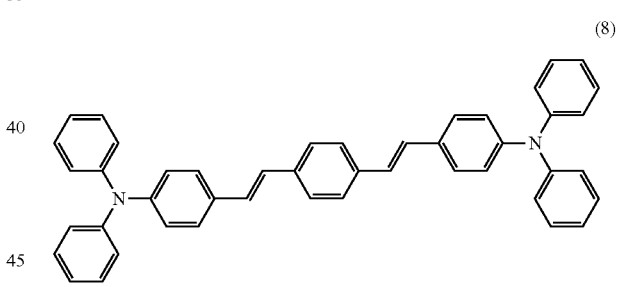

The blue phosphorescent material is not particularly limited as long as it emits blue phosphorescence, and, examples thereof include metal complexes such as an iridium complex, a ruthenium complex, a platinum complex, an osmium complex, a rhenium complex, and a palladium complex. Specific examples thereof include bis[4,6-difluorophenylpyridinate-N,$C^{2'}$]-picolinate-iridium, tris[2-(2,4-difluorophenyl)pyridinate-N,$C^{2'}$]iridium, bis[2-(3,5-trifluoromethyl)pyridinate-N,$C^{2'}$]-picolinate-iridium, and bis(4,6-difluorophenylpyridinate-N,$C^{2'}$)iridium (acetylacetonate).

Meanwhile, as the constituent material of the blue light-emitting layer 63, a host material (second host material) using the blue luminescent material as a guest material is included in addition to the blue luminescent material (luminescent material). This host material recombines holes and electrons to generate exitons, and simultaneously transfers (Forster-transfers or Dexter-transfers) energy of the excitons to the blue luminescent material to have a function of exciting the blue luminescent material. For example, such a host material is doped with the blue luminescent material (guest material)

as a luminescent dopant, and is then used. As this second host material, a host material which is the same as the above-described first host material of the red light-emitting layer 61 can be used, but, among them, an acene-based compound is preferable. Since the acene-based compound is a host material having high electron transportability, it can be suitably used as the host material of the blue light-emitting layer 63 required to easily supply electrons to the red light-emitting layer 61 side and the intermediate layer 62 side.

Meanwhile, as the constituent material of the blue light-emitting layer 63, an assist dopant material (second assist dopant material) is included in addition to the blue luminescent material (luminescent material) and the host material (second host material).

This assist dopant material is a material having mobility opposite to the host material, that is, a material having high hole transportability when the host material has high electron transportability. Further, this assist dopant material is a material having high electron transportability when the host material has high hole transportability. Since this assist dopant material has mobility opposite to the host material, in such a blue light-emitting layer 63, it is possible to transfer holes and electrons with good balance, thus exhibiting a function of adjusting a position in the thickness direction at which excitons are generated by the recombination of holes and electrons. This assist dopant material, for example, is mixed with the host material, and is then used.

Meanwhile, in the blue light-emitting layer 63 with the above configuration, generally, since it is required to easily supply electrons to the red light-emitting layer 61 side, a material having high electron transportability is used as the host material. Therefore, as the assist dopant material, a material having high hole transportability is suitably selected.

The assist dopant material (second assist dopant material) is not particularly limited as long as it has mobility opposite to the host material, but examples thereof include N,N'-di(1-naphthyl)-N,N'-diphenyl-1,1'-biphenyl-4,4'-diamine (α-NPD) represented by the following Formula (2), N,N'-diphenyl-N,N'-bis(3-methylphenyl)-1,1'-biphenyl-4,4'-diamine (TPD), a compound represented by the following Formula (3), a tetraarylbenzidine derivative such as a compound represented by Formula (4), a tetraaryldiaminofluorene compound or a derivative thereof (amine-based compound), an oxadiazole derivative, a perylene derivative, a pyridine derivative, a pyrimidine derivative, a quinoxaline derivative, and a diphenylquinone derivative. They can be used alone or in a combination of two or more thereof.

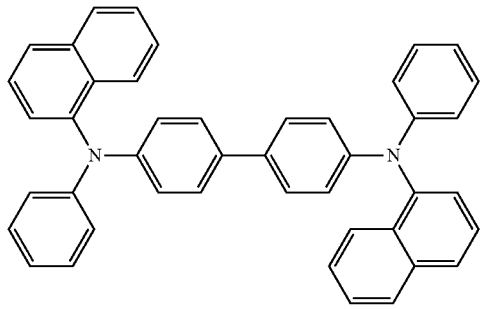

(2)

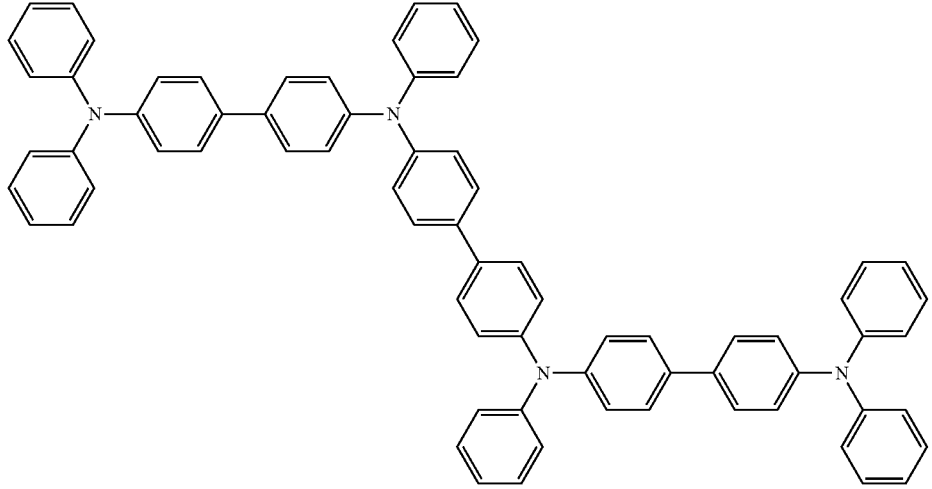

(3)

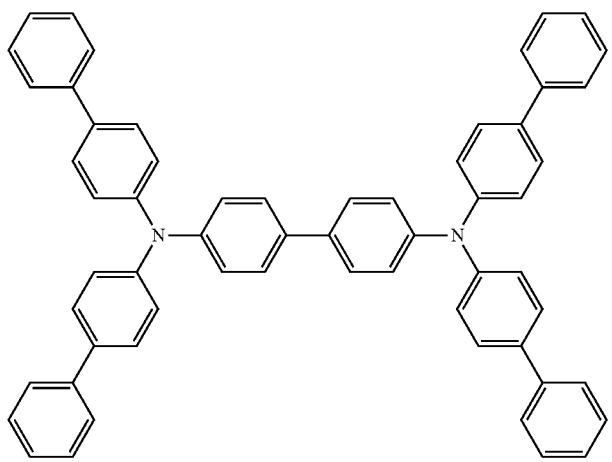

(4)

The content (doping amount) of the blue luminescent material in the blue light-emitting layer 63 is preferably 0.01 wt % to 20 wt %, and more preferably 1 wt % to 15 wt %. When the content of the blue luminescent material is within the above range, it is possible to optimize luminous efficiency, and it is possible to allow the blue light-emitting layer 63 to emit light while adjusting the balance of the luminescence amount between the blue light-emitting layer 63 and the red light-emitting layer 61 or the following green light-emitting layer 64.

The average thickness of the blue light-emitting layer 63 is not particularly limited, but is preferably about 5 nm to 50 nm, and more preferably about 10 nm to 40 nm.

Green Light-Emitting Layer

In the present embodiment, the green light-emitting layer (third light-emitting layer) 64 emits light of green color (third color) different from red color (first color), and is configured to contain a green luminescent material (third luminescent material) emitting light of green color (third color), a host material (third host material) supporting the green luminescent material, and an assist dopant material (third assist dopant material) having mobility opposite to this host material.

Such a green luminescent material is not particularly limited. As the green luminescent material, various green fluorescent materials and green phosphorescent materials can be used alone or in a combination of two or more thereof.

The green fluorescent material is not particularly limited as long as it emits green fluorescence, but examples thereof include a coumarin derivative, quinacridone and a derivative thereof such as a quinacridone derivative represented by the following Formula (9), 9,10-bis[(9-ethyl-3-carbazole)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], and poly[(9,9-dioctyl-2,7-divinylenefluorenylene)-ortho-co-(2-methoxy-5-(2-ethoxyethylhexyloxy)-1,4-phenylene)]. They can be used alone or in a combination of two or more thereof.

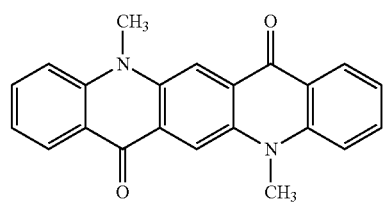

(9)

The green phosphorescent material is not particularly limited as long as it emits green phosphorescence, and, examples thereof include metal complexes such as an iridium complex, a ruthenium complex, a platinum complex, an osmium complex, a rhenium complex, and a palladium complex. Among them, at least one of ligands of this metal complex preferably has a phenyl pyridine skeleton, a bipyridyl skeleton, a porphyrin skeleton, or the like. Specific examples thereof include fac-tris(2-phenylpyridine)iridium (Ir(ppy)3), bis(2-phenylpyridinate-$N,C^{2'}$)iridium (acetylacetonate), and fac-tris[5-fluoro-2-(5-trifluoromethyl-2-pyridine)phenyl-C,N]iridium.

Meanwhile, as the constituent material of the green light-emitting layer 64, a host material (third host material) using the green luminescent material as a guest material is included in addition to the green luminescent material (luminescent material). This host material recombines holes and electrons to generate exitons, and simultaneously transfers (Forster-transfers or Dexter-transfers) energy of the excitons to the green luminescent material to have a function of exciting the green luminescent material. For example, such a host material is doped with the green luminescent material (guest material) as a luminescent dopant, and is then used. As this third host material, a host material which is the same as the above-described first host material of the red light-emitting layer 61 can be used, but, among them, an acene-based compound is preferable. Since the acene-based compound is a host material having high electron transportability, it can be suitably used as the host material of the green light-emitting layer 64 required to easily supply electrons to the red light-emitting layer 61 and the intermediate layer 62 side.

Meanwhile, as the constituent material of the green light-emitting layer 64, an assist dopant material (third assist dopant material) having mobility opposite to the host material is included in addition to the green luminescent material (luminescent material) and the host material (third host material).

Since this assist dopant material has mobility opposite to the host material, in such a green light-emitting layer 64, it can exhibit a function of adjusting a position in the thickness direction at which excitons are generated by the recombination of holes and electrons. This assist dopant material, for example, is mixed with the host material, and is then used.

As the assist dopant material (third assist dopant material), for example, an assist dopant material which is the same as the above-described second assist dopant material of the blue light-emitting layer 63 can be used.

Meanwhile, in the green light-emitting layer 64 with above configuration, similarly to the blue light-emitting layer 63, generally, since it is required to easily supply electrons to the red light-emitting layer 61 side and the intermediate layer 62 side, a material having high electron transportability is used as the host material. Therefore, as the assist dopant material, a material having high hole transportability is suitably selected.

The content (doping amount) of the green luminescent material in the green light-emitting layer 64 is preferably 0.01 wt % to 20 wt %, and more preferably 0.5 wt % to 15 wt %. When the content of the green luminescent material is within the above range, it is possible to optimize a luminous efficiency, and it is possible to allow the green light-emitting layer 64 to emit light while adjusting the balance of the luminescence amount between the green light-emitting layer 64 and the red light-emitting layer 61 or the blue light-emitting layer 63.

The average thickness of the green light-emitting layer 64 is not particularly limited, but is preferably about 5 nm to 50 nm, and more preferably about 10 nm to 40 nm.

As described above, in the present embodiment, the intermediate layer 62, the blue light-emitting layer 63, and the green light-emitting layer 64 are sequentially laminated on one side of the red light-emitting layer 61 toward the cathode 9, from the anode 3 toward the cathode 9.

Generally, in the intermediate layer, blue light-emitting layer and green light-emitting layer, it is required to easily supply electrons to the red light-emitting layer located on the side of the intermediate layer toward the anode, and thus a material having high electron transportability is used as the host material. Therefore, bias increases in the carrier transportability of electrons, and thus the recombination sites of carriers are concentrated in the vicinity of the interface between the intermediate layer and the blue light-emitting layer. As a result, the light-emitting element configured in this manner is generally problematic in that the luminance of the blue light-emitting layer tends to deteriorate locally.

In order to overcome such a problem, it is considered that each of the blue light-emitting layer and the green light-emitting layer is configured to contain an assist dopant material having mobility opposite to the host material (having high hole transportability) as a constituent material in addition to the luminescent material and the host material. When each of the light-emitting layer contains the assist dopant material, it is possible to control the carrier transportability in each of the light-emitting layer, and thus the position in the thickness direction at which excitons are generated by the recombination of holes and electrons can be adjusted, and high efficiency and long lifetime of the light-emitting element can be obtained. However, simply, just when each of the light-emitting layers contains the assist dopant material, the carrier transportability of holes and electrons cannot be sufficiently controlled, and the recombination position of carriers in the light-emitting layer cannot be set to a good position.

More specifically, when each of the light-emitting layers contains the assist dopant material, there occurred a new problem that holes are easily transported in these light-emitting layers, and thus holes are supplied to the cathode compared to the green light-emitting layer, and the constituent materials contained in the electron transporting layer are deteriorated and degraded, thereby deteriorating the luminescence characteristics of the light-emitting element.

In order to solve such a problem, in the invention, the intermediate layer 62 contains a host material and an assist dopant material, and the blue light-emitting layer (second light-emitting layer) 63 and the green light-emitting layer (third light-emitting layer) 64 each contain a luminescent material, a host material, and an assist dopant material. In this case, when the contents of assist dopant materials (second assist dopant material, third assist dopant material, and fourth assist dopant material) in the blue light-emitting layer (second light-emitting layer) 63, the green light-emitting layer (third light-emitting layer) 64, and the intermediate layer 62 are expressed by $C_{Assist}$ (EML2), $C_{Assist}$ (EML3), and $C_{Assist}$ (IML), the contents of the assist dopant materials are set to satisfy the following Relational Expression (A).

$$C_{Assist}(IML) > C_{Assist}(EML2) \geq C_{Assist}(EML3) \quad (A).$$

As such, in the invention, each of the contents of the assist dopant materials in the blue light-emitting layer 63 and the green light-emitting layer 64, is set to be low compared to the content of the assist dopant material in the intermediate layer 62. Thus, in the intermediate layer 62, holes are easily transported, but, in the blue light-emitting layer 63 and the green light-emitting layer 64, the transportation of holes is inhibited, compared to in the intermediate layer 62. As a result, it is appropriately suppressed or prevented that holes having passed through the intermediate layer 62 pass through both the blue light-emitting layer 63 and the green light-emitting layer 64 and then reach the cathode 9. That is, the blue light-emitting layer 63 and the green light-emitting layer 64 function as a block layer suppressing or preventing the passage of holes toward the cathode 9, compared to the green light-emitting layer 64. Therefore, it is possible to accurately suppress or prevent the alteration or degradation of the constituent material contained in the electron transport layer 7 or the like. Meanwhile, the function as a block layer can be remarkably exhibited by the green light-emitting layer 64 when the concentrations of assist dopant materials in the blue light-emitting layer 63 and the green light-emitting layer 64 satisfy the relationship of $C_{Assist}(EML2) > C_{Assist}(EML3)$. For this reason, it is preferable that the concentrations of assist dopant materials in the blue light-emitting layer 63 and the green light-emitting layer 64 satisfy the relationship of $C_{Assist}(EML2) > C_{Assist}(EML3)$.

From the above, the position where carrier are recombined can be spaced sufficiently from the vicinity of the interface between the intermediate layer 62 and the blue light-emitting layer 63, and this recombination site can be suitably spread over the light-emitting layers 63 and 64, and thus local deterioration of a luminescent material (dopant material) in the vicinity of the interface is suppressed. As a result, the light-emitting element 1 has excellent luminescence characteristics and lifetime characteristics maintaining such luminescence characteristics over a long period of time.

Meanwhile, in each of the intermediate layer 62 and the light-emitting layers 63 and 64, when mobility of holes is expressed by $\mu h$ [cm$^2$/Vs] and mobility of electrons is expressed by $\mu e$ [cm$^2$/Vs], in the intermediate layer 62 and the blue light-emitting layer 63, it is preferable that the mobility ratio μe/μh, that is, the relationship of mobility of holes and mobility of electrons in the intermediate layer 62 and the blue light-emitting layer 63 satisfies the following Relational Expression (1).

$$0.01 \leq \mu e/\mu h \leq 100 \tag{1}$$

When the Relational Expression (A) is satisfied, the relationship of the Relational Expression (1) can be easily satisfied, and thus, in the intermediate layer 62 and the blue light-emitting layer 63, it is possible to transfer holes and electrons with good balance. Therefore, the position where carrier are recombined (recombination site) can be spaced sufficiently from the vicinity of the interface between the intermediate layer 62 and the blue light-emitting layer 63, and this recombination site can be spread over the blue light-emitting layer 63 in a wider range, thus satisfactorily exhibiting the above effect.

Meanwhile, the value of mobility ratio μe/μh can be obtained by measuring hole mobility and electron mobility of the light-emitting layer using impedance spectroscopy and then calculating the ratio thereof.

The value of μe/μh, as shown in the Relational Expression (1), is preferably 0.01 to 100, and more preferably 0.1 to 10. Thus, it is possible to spread the recombination site in the blue light-emitting layer 63 more reliably.

Further, in the green light-emitting layer 64, it is preferable that the mobility ratio μe/μh, that is, the relationship of mobility of holes and mobility of electrons in the green light-emitting layer 64 satisfies the following Relational Expression (2).

$$\mu e/\mu h \geq 100 \tag{2}$$

When the Relational Expression (A) is satisfied, particularly, when the relationship of $C_{Assist}(EML2) > C_{Assist}(EML3)$ is satisfied, the Relational Expression (2) can be easily satisfied, and thus, in the green light-emitting layer 64, it is possible to reliably suppress or prevent the holes having passed through the blue light-emitting layer 63 from passing through the green light-emitting layer 64 and then reaching the cathode 9 side. Further, since the holes not having reached the cathode 9 are recombined with electrons in the green light-emitting layer 64, the luminous efficiency in the green light-emitting layer 64 can be improved.

The value of μe/μh, as shown in the Relational Expression (2), is preferably 100 or more, and more preferably 150 to 300. Thus, since it is possible to prevent holes from reaching the cathode 9 more reliably, the luminous efficiency in the green light-emitting layer 64 can be more improved.

Meanwhile, when the above-mentioned acene-based compound is used as a host material, an amine-based compound is preferably used as each of the assist dopant materials (second to fourth assist dopant materials). Accordingly, the Relational Expression (A) is satisfied, and thus the value of μe/μh can easily satisfy the Relational Expressions (1) and (2).

Further, it is preferable that the acene-based compound is a compound represented by the above Formula (4). Thus, the above effect can be remarkably exhibited.

Meanwhile, it is preferable that the assist dopant materials (second to fourth assist dopant materials) contained in the intermediate layer 62 and the light-emitting layers 63 and 64 are homogeneous or identical to each other, and it is preferable that the host materials (second to fourth host materials) contained in the intermediate layer 62 and the light-emitting layers 63 and 64 are homogeneous or identical to each other.

Accordingly, the Relational Expression (A) is satisfied, and thus the value of μe/μh can easily satisfy the Relational Expressions (1) and (2).

Meanwhile, the content of the assist dopant material, specifically, the content of the assist dopant material in each of the intermediate layer 62 and the blue light-emitting layer 63 is preferably 20 wt % or more and 70 wt % or less, more preferably 20 wt % or more and 50 wt % or less. By setting the content of the assist dopant material to be within the above range, the content thereof can be easily set to satisfy the above Relational Expression (1). Further, the content of the assist dopant material in the green light-emitting layer 64 is preferably 0 wt % or more and less than 20 wt %, and more preferably 0 wt % or more and 10 wt % or less. By setting the content of the assist dopant material to be within the above range, the content thereof can be easily set to satisfy the above Relational Expression (2).

Meanwhile, the thickness of each of the blue light-emitting layer 63 and the green light-emitting layer 64 is not particularly limited as long as it is within the above range, but, when the thicknesses of the light-emitting layers 63 and 64 are respectively expressed by T(EML2) and T(EML3), it is preferable that the thicknesses T(EML2) and T(EML3) satisfy the relationship of T(EML2)≤T(EML3). As such, when thickness of the green light-emitting layer 64 is equal to or greater than that of the blue light-emitting layer 63, it is possible for the green light-emitting layer 64 to exhibit the function as a block layer suppressing or preventing the passage of holes toward the cathode 9 side.

Electron Transporting Layer

The electron transporting layer 7 has a function of transporting the electrons injected from the cathode 9 through the electron injection layer 8 to the green light-emitting layer 64.

Examples of the constituent material (electron transporting material) of the electron transporting layer 7 include a phenanthroline derivative such as 2,9-dimethyl-4,7-diphenyl-1,10-phenanthroline (BCP), a quinoline derivative such as tris(8-quinolinolato)aluminum ($Alq_3$) represented by the following Formula (10) which is an organic metal complex having 8-quinolinol or a derivative thereof as a ligand, a azaindolizine derivative such as a compound represented by the following Formula (11), an oxadiazole derivative, a perylene derivative, a pyridine derivative, a pyrimidine derivative, a quinoxaline derivative, a diphenylquinone derivative, and a nitro-substituted fluorene derivative. They can be used alone or in a combination of two or more thereof.

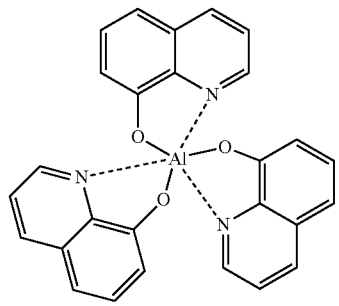

(10)

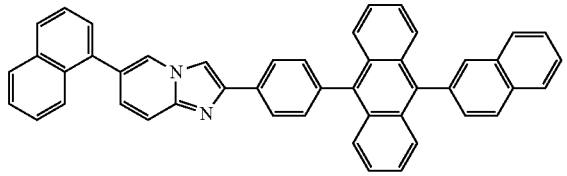

(11)

The average thickness of the electron transporting layer 7 is not particularly limited, but is preferably about 0.5 nm to 100 nm, and more preferably about 1 nm to 50 nm.

Meanwhile, this electron transporting layer 7 may be omitted by the combination of the constituent materials contained in the electron injection layer 8 and the green light-emitting layer 64.

Electron Injection Layer

The electron injection layer 8 is a layer having a function of improving an electron injection efficiency from the cathode 9.

As the constituent material (electron injecting material) of the electron injection layer 8, there are exemplified various inorganic insulating materials and various inorganic semiconductor materials.

Examples of the inorganic insulating materials include alkali metal chalcogenides (oxides, sulfides, selenides, tellurides), alkaline earth metal chalcogenides, alkali metal halides, and alkaline earth metal halides. They can be used alone or in a combination of two or more thereof. When the electron injection layer is formed using this inorganic insulating material as a main material, it is possible to more improve electron injecting performance. Particularly, since an alkali metal compound (alkali metal chalcogenide or alkali metal halide) has a very low work function, when the electron injection layer 8 is formed using this alkali metal compound, the light-emitting element exhibits high luminance.

Examples of alkali metal chalcogenides include $Li_2O$, LiO, $Na_2S$, $Na_2Se$, and NaO.

Examples of alkaline earth metal chalcogenides include CaO, BaO, SrO, BeO, BaS, MgO, and CaSe.

Examples of alkali metal halides include CsF, LiF, NaF, KF, LiCl, KCl, and NaCl.

Examples of alkaline earth metal halides include $CaF_2$, $BaF_2$, $SrF_2$, $MgF_2$, and $BeF_2$.

Examples of inorganic semiconductor materials include oxides, nitrides, and oxynitrides each containing at least one element of Li, Na, Ba, Ca, Sr, Yb, Al, Ga, In, Cd, Mg, Si, Ta, Sb, and Zn. They can be used alone or in a combination of two or more thereof.

The average thickness of this electron injection layer 8 is not particularly limited, but is preferably about 0.1 nm to 1000 nm, more preferably about 0.2 nm to 100 nm, and still more preferably 0.2 nm to 50 nm.

Meanwhile, this electron injection layer 8 may be omitted by the combination of the constituent materials contained in the cathode 9 and the electron transporting layer 7.

Sealing Member

The sealing member 10 is provided to cover the anode 3, the laminate 15, and the cathode 9, and has a function of hermetically sealing these components and blocking oxygen or moisture. When the sealing member 10 is provided, it is possible to obtain the effects in improving the reliability of the light-emitting element 1 and preventing the alteration and degradation thereof (improving the durability thereof.

Examples of the constituent material of the sealing member 10 include Al, Au, Cr, Nb, Ta, Ti, and alloys thereof, silicon oxide, and various resin materials. When a material having conductivity is used as the constituent material of the sealing member 10, in order to short-circuiting, if necessary, an insulation film is preferably provided between the sealing member 10 and the anode 3, the sealing member 10 and the laminate 15, and the sealing member 10 and the cathode 9.

In addition, the sealing member 10 has a flat plate shape. The sealing member 10 faces the substrate 2, and the space between the sealing member 10 and the substrate 2 may be sealed with a sealant such as a thermosetting resin.

The above-described light-emitting element 1, for example, can be manufactured as follows.

[1] First, a substrate 2 is prepared, and an anode is formed on the substrate 2.

The anode 3 can be formed by chemical vapor deposition (CVD) such as plasma CVD or thermal CVD, dry plating such as vacuum deposition, wet plating such as electroplating, a spraying method, a sol-gel method, a MOD method, metal foil junction, or the like.

[2] Next, a hole injection layer 4 is formed on the anode 3.

The hole injection layer 4 can be formed by CVD or a gas-phase process using dry plating such as vacuum deposition or sputtering.

In addition, the hole injection layer 4 can be formed by supplying a material for forming a hole injection layer, the material being prepared by dissolving a hole injecting material in a solvent or dispersing it in a dispersion medium, onto the anode 3 and then drying the material (removing a solvent or a dispersion medium).

As the method of supplying the material for forming a hole injection layer, various application methods, such as spin coating, roll coating and ink jet printing, can be used. When such application methods are used, the hole injection layer 4 can be formed comparatively easily.

As the solvent or dispersion medium used in the preparation of the material for forming a hole injection layer, there are exemplified various inorganic solvent, various organic solvent, and mixed solvents thereof.

In addition, the drying of the applied material can be performed by leaving under the atmosphere or depressurizing atmosphere, heat treatment or spraying of inert gas.

Prior to this step, the upper surface of the anode 3 may be treated with oxygen plasma. Thus, lyophilicity can be imparted to the upper surface of the anode 3, organic matter attached to the upper surface of the anode 3 can be removed (the upper surface of the anode 3 can be washed), and the work function of the vicinity of the upper surface of the anode 3 can be adjusted.

Here, preferably, the oxygen plasma treatment is performed under the conditions of a plasma power of about 100 W to 800 W, an oxygen gas flow rate of about 50 mL/min to 100 mL/min, a member to be processed (anode 3) transportation speed of about 0.5 mm/sec to 10 mm/sec, and temperature of the substrate 2 of about 70° C. to 90° C.

[3] Next, a hole transporting layer 5 is formed on the hole injection layer 4.

The hole transporting layer 5 can be formed by CVD or a gas-phase process using dry plating such as vacuum deposition or sputtering.

In addition, the hole transporting layer 5 can be formed by supplying a material for forming a hole transporting layer, the material being prepared by dissolving a hole transporting material in a solvent or dispersing it in a dispersion medium, onto the hole injection layer 4 and then drying the material (removing a solvent or a dispersion medium).

[4] Next, a red light-emitting layer 61 is formed on the hole transporting layer 5.

The red light-emitting layer 61 can be formed by CVD or a gas-phase process using dry plating such as vacuum deposition or sputtering.

[5] Next, an intermediate layer 62 is formed on the red light-emitting layer 61.

The intermediate layer 62 can be formed by CVD or a gas-phase process using dry plating such as vacuum deposition or sputtering.

[6] Next, a blue light-emitting layer 63 is formed on the intermediate layer 62.

The blue light-emitting layer 63 can be formed by CVD or a gas-phase process using dry plating such as vacuum deposition or sputtering.

[7] Next, a green light-emitting layer 64 is formed on the blue light-emitting layer 63.

The green light-emitting layer 64 can be formed by CVD or a gas-phase process using dry plating such as vacuum deposition or sputtering.

[8] Next, an electron transporting layer 7 is formed on the green light-emitting layer 64.

The electron transporting layer 7 can be formed by CVD or a gas-phase process using dry plating such as vacuum deposition or sputtering.

In addition, the electron transporting layer 7 can be formed by supplying a material for forming an electron transporting layer, the material being prepared by dissolving an electron transporting material in a solvent or dispersing it in a dispersion medium, onto the green light-emitting layer 64 and then drying the material (removing a solvent or a dispersion medium).

[9] Next, an electron injection layer 8 is formed on the electron transporting layer 7.

When an inorganic material is used as the constituent material of the electron injection layer 8, the electron injection layer 8 can be formed by CVD, a gas-phase process using dry plating such as vacuum deposition or sputtering, or application and burning of inorganic particle ink.

[10] Next, a cathode 9 is formed on the electron injection layer 8.

The cathode 9 can be formed by vacuum deposition, sputtering, metal foil junction, or application and burning of metal particle ink.

Through the above steps, a light-emitting element 1 is obtained.

Finally, the obtained light-emitting element 1 is covered with the sealing member 10, and is attached to the substrate 2.

The above-mentioned light-emitting element 1 can be used in a light-emitting device (light-emitting device of the invention).

Such a light-emitting device can be driven at a comparatively low voltage because it is equipped with the above-mentioned light-emitting element 1.

In addition, such a light-emitting device can be used as a light source used in illumination or the like.

Meanwhile, when the plurality of light-emitting elements 1 in the light-emitting device are arranged in a matrix manner, it is possible to constitute a light-emitting device used in a display device.

Next, an example of a display device employing the display device of the invention will be described.

Figure 2:
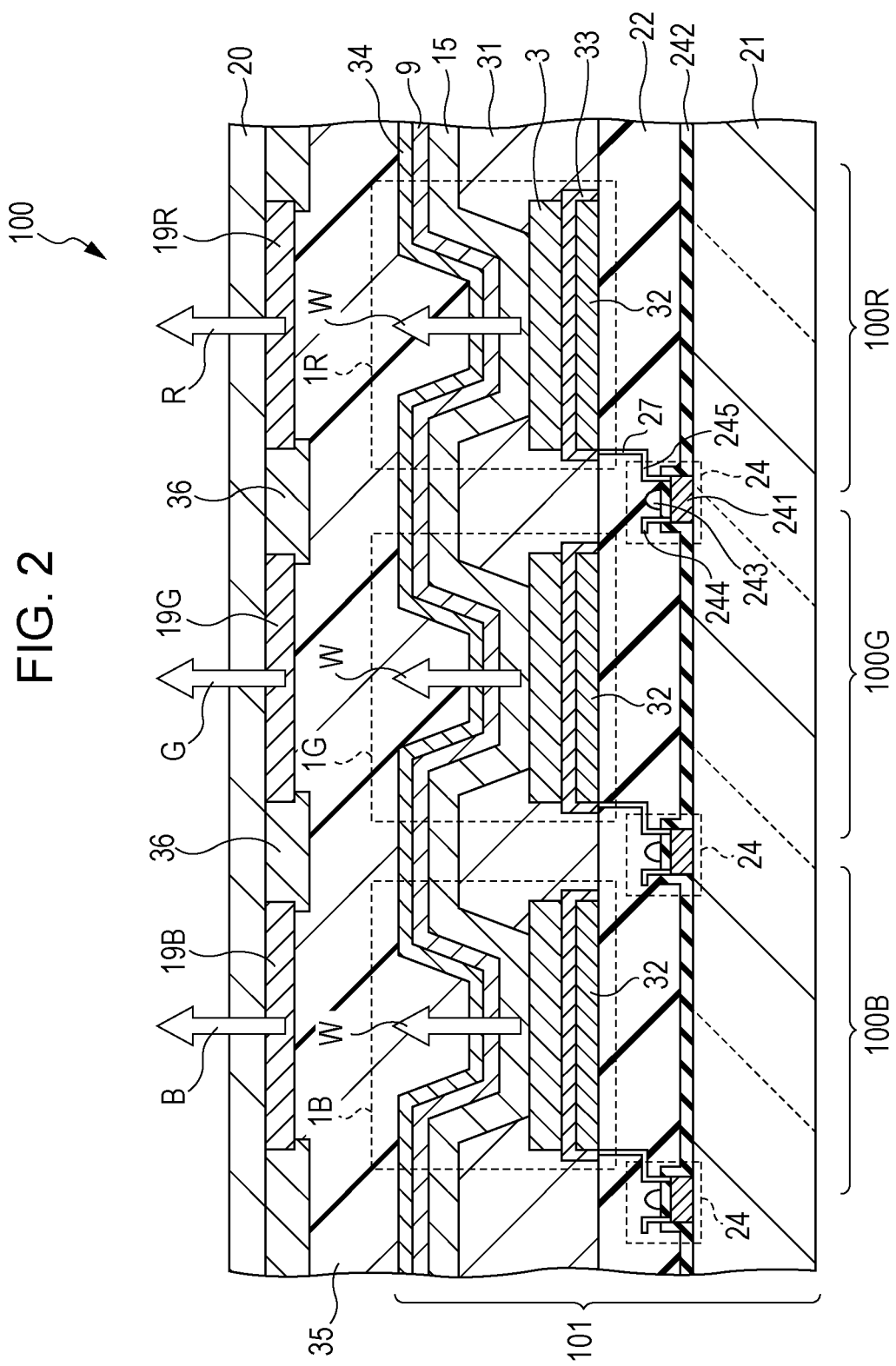
FIG. 2 is a longitudinal sectional view showing an embodiment of a display device employing the display device of the invention.

FIG. 2 is a longitudinal sectional view showing an embodiment of a display device employing the display device of the invention.

The display device 100 shown in FIG. 2 includes: a light-emitting device 101 including a plurality of light-emitting elements 1R, 1G and 1B provided in correspondence with sub-pixels 100R, 100G and 100B; and color filters 19R, 19G and 19B. Here, the display device 100 is a display panel having a top emission structure. The drive system of the display device 100 is not particularly limited, and may be either an active matrix system or a passive matrix system.

The light-emitting device 101 has a substrate 21, light-emitting elements 1R, 1G and 1B, and driving transistors 24.

A plurality of driving transistors 24 are provided on the substrate 21, and a planarizing layer 22 made of an insulating material is formed thereon to cover these driving transistors 24.

Each of the driving transistors 24 has a silicon-made semiconductor layer 241, a gate insulation layer 242 formed on the semiconductor layer 241, a gate electrode 243 formed on the gate insulation layer 242, a source electrode 244, and a drain electrode 245.

The planarizing layer 22 is provided with light-emitting elements 1R, 1G and 1B in correspondence with each of the driving transistors 241.

The light-emitting element 1R is configured such that a reflective film 32, an anti-corrosive film 33, an anode 3, a laminate 15, a cathode 9, and a cathode cover 34 are sequentially laminated on the planarizing layer 22. In the present embodiment, the anode 3 of each of the light-emitting elements 1R, 1G and 1B constitutes a pixel electrode, and is electrically connected to the drain electrode 245 of each of the driving transistors 24 by a conductive part (wiring) 27. In addition, the cathode 9 of each of the light-emitting elements 1R, 1G and 1B is used as a common electrode.

The configuration of each of the light-emitting elements 1G and 1B is the same as that of the light-emitting element 1R. In FIG. 2, the same elements as in FIG. 1 are indicated by the same reference numerals. The configuration (feature) of the reflective film 32 may be different between the light-emitting elements 1R, 1G and 1B depending on the wavelength of light. Partition walls 31 are respectively provided between the adjacent light-emitting elements 1R, 1G and 1B.

Meanwhile, an epoxy layer 35 made of an epoxy resin is formed on the light-emitting device 101 to cover this light-emitting device 101.

The color filters 19R, 19G and 19B are provided on the above-mentioned epoxy layer 35 in correspondence with the light-emitting elements 1R, 1G and 1B.

The color filter 19R converts white light W emitted from the light-emitting element 1R into red light. The color filter 19G converts white light W emitted from the light-emitting element 1G into green light. The color filter 19B converts white light W emitted from the light-emitting element 1B into blue light. When these color filters 19R, 19G and 19B are used in combination with the light-emitting elements 1R, 1G and 1B, it is possible to display a full color image.

Light-shielding layers 36 are respectively provided between the adjacent color filters 19R, 19G and 19B. Thus, it is possible to prevent unintended sub-pixels 100R, 100G, and 100B from emitting light.

A sealing substrate 20 is provided on the color filters 19R, 19G and 19B and the light-shielding layers 36 to cover them.

The above-mentioned display device 100 may be a monochromatic display device, and can realize a color display by selecting the luminescent material used in each of the light-emitting elements 1R, 1G and 1B.

This display device 100 (display device of the invention) can be driven at a comparatively low voltage because it uses the above-mentioned light-emitting device. Thus, it is possible to display a high-quality image with low power consumption.

Figure 3:
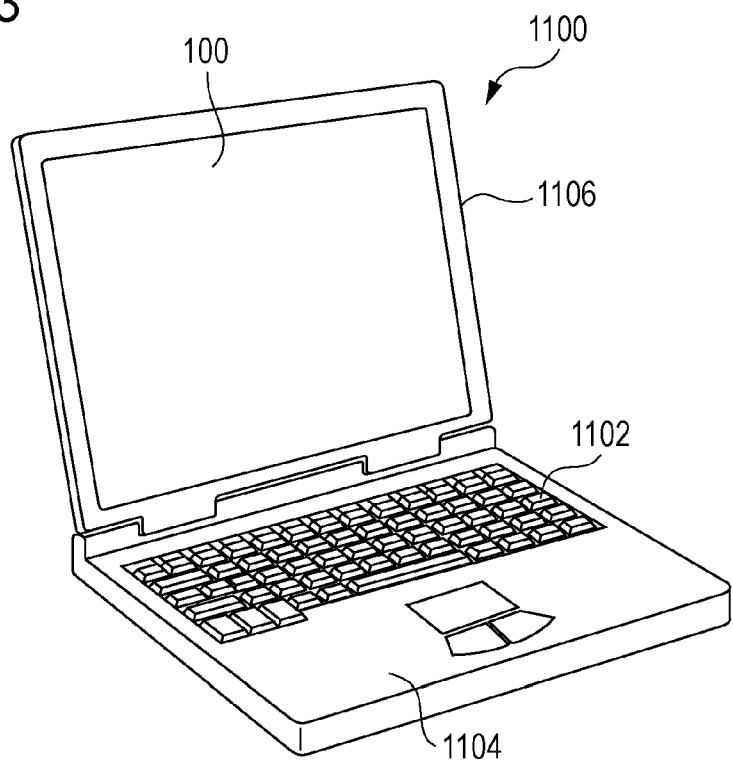
FIG. 3 is a perspective view showing a configuration of a mobile type (or notebook type) personal computer employing the electronic apparatus of the invention.

FIG. 3 is a perspective view showing a configuration of a mobile type (or notebook type) personal computer employing the electronic apparatus of the invention.

In FIG. 3, the personal computer 1100 includes a main body 1104 equipped with a keyboard 1102; and a display unit 1106 equipped with a display. The display unit 1106 is rotatably supported to the main body 1104 through a hinge structure.

In this personal computer 1100, the display of the display unit 1106 is composed of the above-mentioned display device 100.

Figure 4:
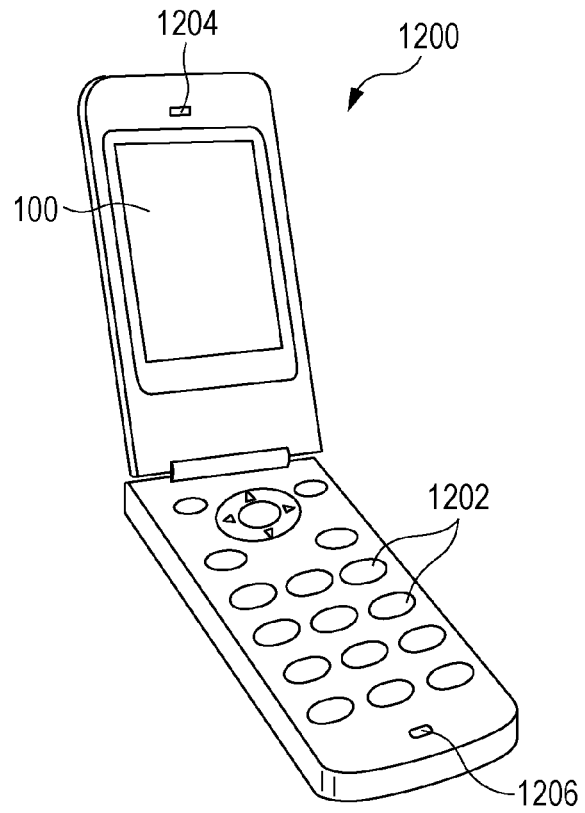
FIG. 4 is a perspective view showing a configuration of a mobile phone (including PHS) employing the electronic apparatus of the invention.

FIG. 4 is a perspective view showing a configuration of a mobile phone (including PHS) employing the electronic apparatus of the invention.

In FIG. 4, the mobile phone 1200 includes a plurality of manual operation buttons 1202, an ear piece 1204, a mouthpiece 1206, and a display.

In the mobile phone 1200, this display is composed of the above-mentioned display device 100.

Figure 5:
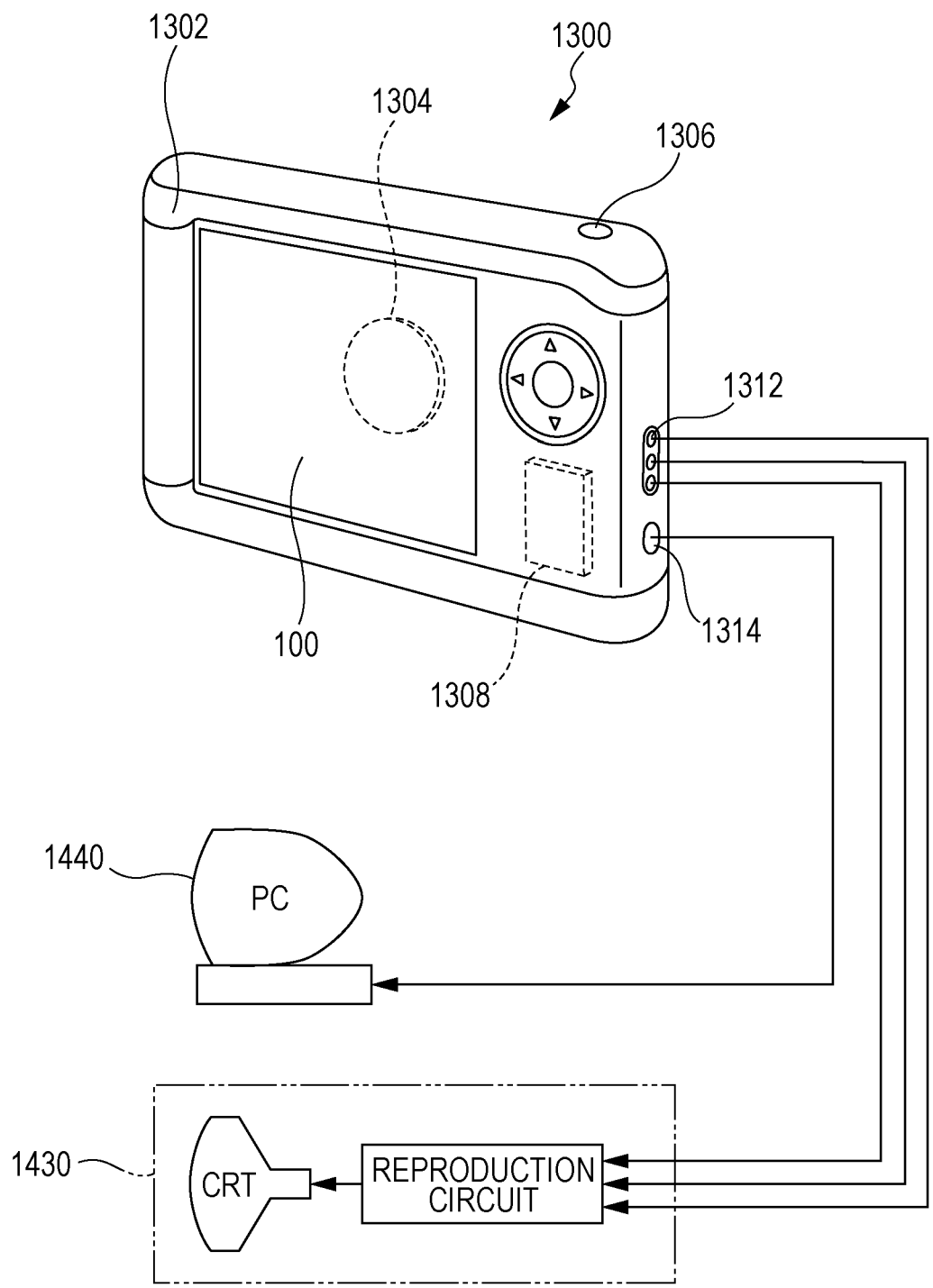
FIG. 5 is a perspective view showing a configuration of a digital still camera employing the electronic apparatus of the invention.

FIG. 5 is a perspective view showing a configuration of a digital still camera employing the electronic apparatus of the invention. In FIG. 5, the connection between the digital still camera and external devices is also briefly shown.

Here, a general camera exposes a silver salt film by the optical image of an object, whereas the digital still camera 1300 photoelectrically converts the optical image of an object using an imaging device such as a charge coupled device (CCD) to generate imaging signals (image signals).

A display is provided on the back side of the case (body) 1302 in the digital still camera 1300 to perform a displaying on the basis of the imaging signals caused by CCD. This display functions as a finder displaying an object as an electronic image.

In the digital still camera 1300, this display is composed of the above-mentioned display device 100.

The case 1302 is provided therein with a circuit board 1308. This circuit board 1308 is provided with memory capable of storing imaging signals.

In addition, the case 1302 is provided at the front side thereof (back side in the illustrated configuration) with a light-receiving unit 1304 including an optical lens (optical imaging system), CCD, or the like.

When a photographer confirms the image of an object shown in the display and then presses a shutter button 1306, the imaging signals of CCD at that time are transferred to the memory of the circuit board 1308 and stored therein.

Further, in this digital still camera 1300, the case 1302 is provided at the lateral side thereof with a video signal output terminal 1312 and an input-output terminal 1314 for data communication. As shown in FIG. 5, if necessary, a TV monitor 1430 is connected to the video signal output terminal 1312, and a personal computer 1440 is connected to the input-output terminal 1314 for data communication. Moreover, the imaging signals stored in the memory of the circuit board 1308 are outputted to the TV monitor 1430 or the personal computer 1440 by a predetermined operation.

The electronic apparatus of the invention can be applied to TVs, video cameras, viewfinder type and monitor direct view type videos tape recorders, laptop personal computers, car navigation equipment, pagers, electronic notebooks (including communication functions), electronic dictionaries, electronic calculators, electronic game equipment, word processors, workstations, video telephones, security television monitors, electronic binoculars, POS terminals, equipment provided with touch panels (for example, cash dispensers for financial institutions, and automatic ticket vending machines), medical equipment (for example, electronic thermometers, sphygmomanometers, blood glucose meters, electrocardiography displays, ultrasonographs, and endoscopic displays), fish sonars, various measurement equipment, meters and gauges (for example, meters and gauges for vehicles, aircrafts and ships), flight simulators, various other monitors, projection type displays such as projectors, and the like, in addition to the personal computer (mobile personal computer) of FIG. 3, the mobile phone of FIG. 4, and the digital still camera of FIG. 5.

As above, the light-emitting element, light-emitting device, display device and electronic apparatus of the invention have been described based on the illustrated embodiments, but the invention is not limited thereto.

For example, in the above-mentioned embodiment, there has been described a case that the blue luminescent material (second luminescent material) contained in the blue light-emitting layer (second light-emitting layer) is different (in kind) from the green luminescent material (third luminescent material) contained in the green light-emitting layer (third light-emitting layer), and thus the blue light-emitting layer (second light-emitting layer) emits blue light and the green light-emitting layer (third light-emitting layer) emits green light, that is, the second light-emitting layer and the third light-emitting layer emit different light, but the invention is not limited to this case. For example, the second luminescent material and the third luminescent material respectively contained in the second light-emitting layer and the third light-emitting layer may be identical to each other, and thus the light-emitting element may be configured to allow the second light-emitting layer and the third light-emitting layer to emit the same light of blue light or green light. Here, the "luminescent materials identical to each other" refer to any luminescent materials as long as they emit light of the same color, and the "luminescent material different from each other" refer to any luminescent materials as long as they emit light of different color.

Further, in the above embodiment, a case that each of the blue light-emitting layer and the green light-emitting layer constituting the light-emitting element is configured to contain a luminescent material, a host material, and an assist dopant material has been described, but the invention is not limited to this case. For example, the red light-emitting layer constituting the light-emitting element may be configured to contain an assist dopant material in addition to a luminescent material and a host material.

Moreover, in the above embodiment, a light-emitting element having a light-emitting layer of three layers has been described, but the light-emitting element may have a light-emitting layer of four or more layers.

EXAMPLES

Next, specific examples of the invention will be described.

1. Manufacture of Light-Emitting Element

Example 1A

<1> First, a transparent glass substrate having an average thickness of 0.5 mm was prepared. Then, an ITO electrode (anode) having an average thickness of 50 nm was formed on this substrate by sputtering.

Meanwhile, the substrate was immersed in acetone and 2-propanol in this order, ultrasonically cleaned, and then treated with oxygen plasma.

<2> Then, N,N'-bis(1-naphthyl)-N,N'-diphenyl[1,1'-biphenyl]-4,4'-diamine (α-NPD) represented was deposited on the ITO electrode by the above Formula (2) by vacuum evaporation to form a hole transporting layer having an average thickness of 40 nm.

<3> Then, a constituent material of a red light-emitting layer was deposited on the hole transporting layer by vacuum evaporation to form a red light-emitting layer (first light-emitting layer) having an average thickness of 5 nm. As the constituent material of the red light-emitting layer, a tetraaryl diindenoperylene derivative represented by the above Formula (5) was used as a red luminescent material (guest material), and a naphthacene derivative represented by the above Formula (7) was used as a host material. The content (doping concentration) of the red luminescent material (dopant) in the red light-emitting layer was set to 1.5 wt %.

<4> Then, a constituent material of an intermediate layer was deposited on the red light-emitting layer by vacuum evaporation to form an intermediate layer having an average thickness of 20 nm. As the constituent material of the intermediate layer, an anthracene derivative represented by the above Formula (6) was used as a host material, and an amine derivative represented by the above Formula (4) was used as an assist dopant material. The mixing ratio of the anthracene derivative represented by the above Formula (6) and the amine derivative represented by the above Formula (4) in the intermediate layer was set to 50:50.

<5> Then, the constituent material of a blue light-emitting layer was deposited on the intermediate layer by vacuum evaporation to form a blue light-emitting layer (second light-emitting layer) having an average thickness of 15 nm. As the constituent material of the blue light-emitting layer, a distyryldiamine-based compound represented by the above Formula (8) was used as a blue luminescent material, an anthracene derivative represented by the above Formula (6) was used as a host material, and an amine derivative represented by the above Formula (4) was used as an assist dopant material. The content (doping concentration) of the blue luminescent material (dopant) in the blue light-emitting layer was set to 8.0 wt %, and the mixing ratio of the anthracene derivative represented by the above Formula (6) and the amine derivative represented by the above Formula (4) was set to 70:30.

<6> Then, a constituent material of a green light-emitting layer was deposited on the blue light-emitting layer by vacuum evaporation to form a green light-emitting layer (third light-emitting layer) having an average thickness of 15 nm. As the constituent material of the green light-emitting layer, a quinacridone derivative represented by the above Formula (9) was used as a green luminescent material (guest material), an anthracene derivative represented by the above Formula (6) was used as a host material, and an amine derivative represented by the above Formula (4) was used as an assist dopant material. The content (doping concentration) of the green luminescent material (dopant) in the green light-emitting layer was set to 1.0 wt %, and the mixing ratio of the anthracene derivative represented by the above Formula (6) and the amine derivative represented by the above Formula (4) was set to 80:20.

Meanwhile, the HOMO level, LUMO level, hole mobility and electron mobility of the anthracene derivative represented by the above Formula (6) used in the above steps <4> to <6> were 5.9 [eV], 2.9 [eV], less than $1.0 \times 10^{-9}$ [cm$^2$/Vs] and $7.0 \times 10^{-6}$ [cm$^2$/Vs], respectively. In addition, the HOMO level, LUMO level, hole mobility and electron mobility of the amine derivative represented by the above Formula (4) were 5.6 [eV], 2.5 [eV], $9.0 \times 10^{-4}$ [cm$^2$/Vs] and less than $1.0 \times 10^{-9}$ [cm$^2$/V], respectively.

<7> Then, a azaindolizine derivative represented was deposited on the green light-emitting layer by the above Formula (11) by vacuum evaporation to form an electron transporting layer having an average thickness of 25 nm.

<8> Then, lithium fluoride (LiF) was deposited on the electron transporting layer by vacuum evaporation to form an electron injection layer having an average thickness of 1 nm.

<9> Then, Al was deposited on the electron injection layer by vacuum evaporation to form an Al-made cathode having an average thickness of 100 nm.

<10> Then, in order to cover these formed layers, these layers were covered with a glass-made protection cover (sealing member), and this protection cover was fixed and sealed with an epoxy resin.

Through the above steps, the light-emitting element of Example 1A, shown in FIG. 1, in which each of the light-emitting layer emits red light, blue light, and green light, was manufactured.

Example 2A

The light-emitting element of Example 2A was manufactured in the same manner as in Example 1A, except that the constituent material of the green light-emitting layer, used in the step <6>, was as follow.

That is, as the constituent material of the green light-emitting layer, a quinacridone derivative represented by the above Formula (9) was used as a green luminescent material (guest material), an anthracene derivative represented by the above Formula (6) was used as a host material, and an amine derivative represented by the above Formula (4) was used as an assist dopant material. The content (doping concentration) of the green luminescent material (dopant) in the green light-emitting layer was set to 1.0 wt %, and the mixing ratio of the anthracene derivative represented by the above Formula (6) and the amine derivative represented by the above Formula (4) was set to 70:30.

Comparative Example 1A

The light-emitting element of Comparative Example 1A was manufactured in the same manner as in Example 1A, except that the constituent materials of the blue light-emitting layer and the green light-emitting layer, used in the steps <5> and <6>, were as follow, respectively.

That is, as the constituent material of the blue light-emitting layer, a distyryldiamine-based compound represented by the above Formula (8) was used as a blue luminescent material, an anthracene derivative represented by the above Formula (6) was used as a host material, and an assist dopant material was not added. The content (doping concentration) of the blue luminescent material (dopant) in the blue light-emitting layer was set to 8.0 wt %.

Further, as the constituent material of the green light-emitting layer, a quinacridone derivative represented by the above Formula (9) was used as a green luminescent material (guest material), an anthracene derivative represented by the above Formula (6) was used as a host material, and an assist dopant material was not added. The content (doping concentration) of the green luminescent material (dopant) in the green light-emitting layer was set to 1.0 wt %.

Comparative Example 2A

The light-emitting element of Comparative Example 2A was manufactured in the same manner as in Example 1A, except that the constituent materials of the blue light-emitting layer and the green light-emitting layer, used in the steps <5> and <6>, were as follow, respectively.

That is, as the constituent material of the blue light-emitting layer, a distyryldiamine-based compound represented by the above Formula (8) was used as a blue luminescent material, an anthracene derivative represented by the above Formula (6) was used as a host material, and an amine derivative represented by the above Formula (4) was used as an assist dopant material. The content (doping concentration) of the blue luminescent material (dopant) in the blue light-emitting layer was set to 8.0 wt %, and the mixing ratio of the anthracene derivative represented by the above Formula (6) and the amine derivative represented by the above Formula (4) was set to 50:50.

As the constituent material of the green light-emitting layer, a quinacridone derivative represented by the above Formula (9) was used as a green luminescent material (guest material), an anthracene derivative represented by the above Formula (6) was used as a host material, and an amine derivative represented by the above Formula (4) was used as an assist dopant material. The content (doping concentration) of the green luminescent material (dopant) in the green light-emitting layer was set to 1.0 wt %, and the mixing ratio of the anthracene derivative represented by the above Formula (6) and the amine derivative represented by the above Formula (4) was set to 50:50.

2. Evaluation 2-1. Evaluation of Mobility Ratio $\mu e/\mu h$

In the light-emitting elements of Examples 1A and 2A and Comparative Examples 1A and 2A, the hole mobility and electron mobility of each of the intermediate layer, blue light-emitting layer, and the green light-emitting layer were measured by impedance spectroscopy, and the ratio thereof was calculated to obtain the mobility ratio $\mu e/\mu h$.

2-2. Evaluation of Emission Lifetime

In the light-emitting elements of Examples 1A and 2A and Comparative Examples 1A and 2A, the initial luminance of the light-emitting element was made constant using a DC power supply, and then the light-emitting element emitted light, and the luminance thereof was measured using a luminance meter. Then, the time (LT80) taken for the measured luminance to become 80% of the initial luminance was measured. With respect to each of the light-emitting elements of Examples 1A and 2A and Comparative Example 2A, when the LT80 measured using the light-emitting element of Comparative Example 1A was set to 100, relative value was obtained.

The evaluation results thereof are summarized in Table 1 below.

TABLE 1

| | | \multicolumn{8}{c}{Thickness: nm} | | |
|---|---|---|---|---|---|---|---|---|---|---|
| | | HTL | EML1 | | Intermediate layer | EML2 (Blue) | | | EML3 (Green) | | |
| Ex. 1A | Material | HTL-1 | Host-2 | RD | Host1 AD-1 | Host-1 AD-1 | BD | Host-1 AD-1 | GD |
| | Concentration | — | — | 1.5 w % | 50:50 | 70:30 | 8 w % | 80:20 | 1 w % |
| | Thickness | 40 | 5 | | 20 | 15 | | 15 | |
| Ex. 2A | Material | HTL-1 | Host-2 | RD | Host1 AD-1 | Host-1 AD-1 | BD | Host-1 AD-1 | GD |
| | Concentration | — | — | 1.5 w % | 50:50 | 70:30 | 8 w % | 80:20 | 1 w % |
| | Thickness | 40 | 5 | | 20 | 15 | | 15 | |
| Comp. Ex. 1A | Material | HTL-1 | Host-2 | RD | Host1 AD-1 | Host-1 AD-1 | BD | Host-1 AD-1 | GD |
| | Concentration | — | — | 1.5 w % | 50:50 | — | 8 w % | — | 1 w % |
| | Thickness | 40 | 5 | | 20 | 15 | | 15 | |
| Comp. Ex. 2A | Material | HTL-1 | Host-2 | RD | Host1 AD-1 | Host-1 AD-1 | BD | Host-1 AD-1 | GD |
| | Concentration | — | — | 1.5 w % | 50:50 | 50:50 | 8 w % | 50:50 | 1 w % |
| | Thickness | 40 | 5 | | 20 | 15 | | 15 | |

| | | | | | | Lifetime | Intermediate | $\mu e/\mu h$ | |
| | | ETL | EIL | Cathode | | LT80 | layer | EML2 | EML3 |
|---|---|---|---|---|---|---|---|---|---|
| Ex. 1A | Material | ETL-1 | LiF | Al | | 230 | 0.1 | 6 | 120 |
| | Concentration | — | — | — | | | | | |
| | Thickness | 25 | 1 | 100 | | | | | |
| Ex. 2A | Material | ETL-1 | LiF | Al | | 180 | 0.1 | 6 | 10 |
| | Concentration | — | — | — | | | | | |
| | Thickness | 25 | 1 | 100 | | | | | |
| Comp. Ex. 1A | Material | ETL-1 | LiF | Al | | 100 | 0.1 | >7000 | >7000 |
| | Concentration | — | — | — | | | | | |
| | Thickness | 25 | 1 | 100 | | | | | |
| Comp. Ex. 2A | Material | ETL-1 | LiF | Al | | 120 | 0.1 | 0.1 | 0.2 |
| | Concentration | — | — | — | | | | | |
| | Thickness | 25 | 1 | 100 | | | | | |

\* Lifetime: time taken for initial luminance to be reduced by 20% when driven at constant current density
Indicated by relative value when time of Comparative Example 1A is set to 100

As is apparent from Table 1, the light-emitting elements of Examples 1A and 2A satisfy the above Relational Expression (A). As a result, the emission lifetime in Examples 1A and 2A increased compared to that in Comparative Examples 1A and 2A.

3. Manufacture of Light-Emitting Element

Example 1B

<1> First, a transparent glass substrate having an average thickness of 0.5 mm was prepared. Then, an ITO electrode (anode) having an average thickness of 50 nm was formed on this substrate by sputtering.

Meanwhile, the substrate was immersed in acetone and 2-propanol in this order, ultrasonically cleaned, and then treated with oxygen plasma.

<2> Then, N,N'-bis(1-naphthyl)-N,N'-diphenyl[1,1'-biphenyl]-4,4'-diamine (α-NPD) represented was deposited on the ITO electrode by the above Formula (2) by vacuum evaporation to form a hole transporting layer having an average thickness of 40 nm.

<3> Then, a constituent material of a red light-emitting layer was deposited on the hole transporting layer by vacuum evaporation to form a red light-emitting layer (first light-emitting layer) having an average thickness of 5 nm. As the constituent material of the red light-emitting layer, a tetraaryl diindenoperylene derivative represented by the above Formula (5) was used as a red luminescent material (guest material), and a naphthacene derivative represented by the above Formula (7) was used as a host material. The content (doping concentration) of the red luminescent material (dopant) in the red light-emitting layer was set to 1.5 wt %.

<4> Then, a constituent material of an intermediate layer was deposited on the red light-emitting layer by vacuum evaporation to form an intermediate layer having an average thickness of 20 nm. As the constituent material of the intermediate layer, an anthracene derivative represented by the above Formula (6) was used as a host material, and an amine derivative represented by the above Formula (4) was used as an assist dopant material. The mixing ratio of the anthracene derivative represented by the above Formula (6) and the amine derivative represented by the above Formula (4) in the intermediate layer was set to 50:50.

<5> Then, a constituent material of a first blue light-emitting layer was deposited on the intermediate layer by vacuum evaporation to form a first blue light-emitting layer (second light-emitting layer) having an average thickness of 15 nm. As the constituent material of the first blue light-emitting layer, a distyryldiamine-based compound represented by the above Formula (8) was used as a blue luminescent material, an anthracene derivative represented by the above Formula (6) was used as a host material, and an amine derivative represented by the above Formula (4) was used as an assist dopant material. The content (doping concentration) of the blue luminescent material (dopant) in the first blue light-emitting layer was set to 8.0 wt %, and the mixing ratio of the anthracene derivative represented by the above Formula (6) and the amine derivative represented by the above Formula (4) was set to 70:30.

<6> Then, a constituent material of a second blue light-emitting layer was deposited on the first blue light-emitting layer by vacuum evaporation to form a second blue light-emitting layer (third light-emitting layer) having an average thickness of 15 nm. As the constituent material of the second blue light-emitting layer, a distyryldiamine-based compound represented by the above Formula (8) was used as a blue luminescent material, an anthracene derivative represented by the above Formula (6) was used as a host material, and an amine derivative represented by the above Formula (4) was used as an assist dopant material. The content (doping concentration) of the blue luminescent material (dopant) in the second blue light-emitting layer was set to 8.0 wt %, and the mixing ratio of the anthracene derivative represented by the above Formula (6) and the amine derivative represented by the above Formula (4) was set to 80:20.

<7> Then, a azaindolizine derivative represented was deposited on the second blue light-emitting layer by the above Formula (11) by vacuum evaporation to form an electron transporting layer having an average thickness of 25 nm.

<8> Then, lithium fluoride (LiF) was deposited on the electron transporting layer by vacuum evaporation to form an electron injection layer having an average thickness of 1 nm.

<9> Then, Al was deposited on the electron injection layer by vacuum evaporation to form an Al-made cathode having an average thickness of 100 nm.

<10> Then, in order to cover these formed layers, these layers was covered with a glass-made protection cover (sealing member), and this protection cover was fixed and sealed with an epoxy resin.

Through the above steps, the light-emitting element of Example 1B, shown in FIG. 1, in which each of the light-emitting layer emits red light, blue light, and green light, was manufactured.

Example 2B

The light-emitting element of Example 2B was manufactured in the same manner as in Example 1B, except that the constituent material of the second blue light-emitting layer, used in the step <6>, was as follow.

That is, as the constituent material of the second blue light-emitting layer, a distyryldiamine-based compound represented by the above Formula (8) was used as a blue luminescent material, an anthracene derivative represented by the above Formula (6) was used as a host material, and an amine derivative represented by the above Formula (4) was used as an assist dopant material. The content (doping concentration) of the blue luminescent material (dopant) in the blue light-emitting layer was set to 8.0 wt %, and the mixing ratio of the anthracene derivative represented by the above Formula (6) and the amine derivative represented by the above Formula (4) was set to 70:30.

Comparative Example 1B

The light-emitting element of Comparative Example 1B was manufactured in the same manner as in Example 1B, except that the constituent materials of the first blue light-emitting layer and the second green light-emitting layer, used in the steps <5> and <6>, were as follow, respectively.

That is, as the constituent materials of each of the first blue light-emitting layer and the second blue light-emitting layer, a distyryldiamine-based compound represented by the above Formula (8) was used as a blue luminescent material, an anthracene derivative represented by the above Formula (6) was used as a host material, and an assist dopant material was not added. The content (doping concentration) of the blue luminescent material (dopant) in the blue light-emitting layer was set to 8.0 wt %.

Comparative Example 2B

The light-emitting element of Comparative Example 2B was manufactured in the same manner as in Example 1B, except that the constituent materials of the first blue light-emitting layer and the second green light-emitting layer, used in the steps <5> and <6>, were as follow, respectively.

That is, as the constituent materials of each of the first blue light-emitting layer and the second blue light-emitting layer, a distyryldiamine-based compound represented by the above Formula (8) was used as a blue luminescent material, an anthracene derivative represented by the above Formula (6) was used as a host material, and an amine derivative represented by the above Formula (4) was used as an assist dopant material. The content (doping concentration) of the blue luminescent material (dopant) in the blue light-emitting layer power supply, and then the light-emitting element emitted light, and the luminance thereof was measured using a luminance meter. Then, the time (LT80) taken for the measured luminance to become 80% of the initial luminance was measured. With respect to each of the light-emitting elements of Examples 1B and 2B and Comparative Example 2B, when the LT80 measured using the light-emitting element of Comparative Example 1B was set to 100, relative value was obtained.

The evaluation results thereof are summarized in Table 2 below.

TABLE 2

| | | Thickness: nm | | | | | | | | | |
|---|---|---|---|---|---|---|---|---|---|---|---|
| | | HTL | EML1 | | | Intermediate layer | EML2 (Blue) | | | EML3 (Blue) | | |
| Ex. 1B | Material Concentration | HTL-1 — | Host-2 — | RD 1.5 w% | | Host1 AD-1 50:50 | Host-1 AD-1 70:30 | | BD 8 w% | Host-1 AD-1 80:20 | | BD 8 w% |
| | Thickness | 40 | 5 | | | 20 | 15 | | | 15 | | |
| Ex. 2B | Material Concentration | HTL-1 — | Host-2 — | RD 1.5 w% | | Host1 AD-1 50:50 | Host-1 AD-1 70:30 | | BD 8 w% | Host-1 AD-1 80:20 | | GD 8 w% |
| | Thickness | 40 | 5 | | | 20 | 15 | | | 15 | | |
| Comp. Ex. 1B | Material Concentration | HTL-1 — | Host-2 — | RD 1.5 w% | | Host1 AD-1 50:50 | — | | BD 8 w% | Host-1 AD-1 — | | GD 8 w% |
| | Thickness | 40 | 5 | | | 20 | 15 | | | 15 | | |
| Comp. Ex. 2B | Material Concentration | HTL-1 — | Host-2 — | RD 1.5 w% | | Host1 AD-1 50:50 | Host-1 AD-1 50:50 | | BD 8 w% | Host-1 AD-1 50:50 | | GD 8 w% |
| | Thickness | 40 | 5 | | | 20 | 15 | | | 15 | | |

| | | | | | | | $\mu e/\mu h$ | | |
|---|---|---|---|---|---|---|---|---|---|
| | | ETL | EIL | Cathode | Lifetime LT80 | Intermediate layer | EML2 | EML3 |
| Ex. 1B | Material Concentration Thickness | ETL-1 — 25 | LiF — 1 | Al — 100 | 230 | 0.1 | 6 | 110 |
| Ex. 2B | Material Concentration Thickness | ETL-1 — 25 | LiF — 1 | Al — 100 | 180 | 0.1 | 6 | 6 |
| Comp. Ex. 1B | Material Concentration Thickness | ETL-1 — 25 | LiF — 1 | Al — 100 | 100 | 0.1 | >7000 | >7000 |
| Comp. Ex. 2B | Material Concentration Thickness | ETL-1 — 25 | LiF — 1 | Al — 100 | 120 | 0.1 | 0.1 | 0.1 |

* Lifetime: time taken for initial luminance to be reduced by 20% when driven at constant current density
Indicated by relative value when time of Comparative Example 1A is set to 100 was set to 8.0 wt %, and the mixing ratio of the anthracene derivative represented by the above Formula (6) and the amine derivative represented by the above Formula (4) was set to 50:50.

4. Evaluation 4-1. Evaluation of Mobility Ratio $\mu e/\mu h$

In the light-emitting elements of Examples 1B and 2B and Comparative Examples 1B and 2B, the hole mobility and electron mobility of each of the intermediate layer and first and second blue light-emitting layers were measured by impedance spectroscopy, and the ratio thereof was calculated to obtain the mobility ratio $\mu e/\mu h$.

4-2. Evaluation of Emission Lifetime

In the light-emitting elements of Examples 1B and 2B and Comparative Examples 1B and 2B, the initial luminance of the light-emitting element was made constant using a DC As is apparent from Table 2, the light-emitting elements of Examples 1B and 2B satisfy the above Relational Expression (A). As a result, the emission lifetime in Examples 1B and 2B increased compared to that in Comparative Examples 1B and 2B.

The entire disclosure of Japanese Patent Application No. 2014-078253, filed Apr. 4, 2014 is expressly incorporated by reference herein.

What is claimed is:
1. A light-emitting element, comprising:
a cathode;
an anode; and
a light-emitting unit provided between the cathode and the anode to emit light when a driving voltage is applied,
wherein the light-emitting unit includes a first light-emitting layer emitting first light, an intermediate layer, a second light-emitting layer emitting second light having a different color from the first light, and a third light-emitting layer emitting third light having a different color from the first light, which are laminated from the anode side to the cathode side, wherein each of the second and third light-emitting layers is configured to contain a luminescent material, a host material, and an assist dopant material, wherein the intermediate layer is configured to contain the host material and the assist dopant material, wherein one of the host material and the assist dopant material is material having high electron transportability, and the other thereof is a material having high hole transportability, and wherein, when the concentrations of the assist dopant materials contained in the second light-emitting layer, the third light-emitting layer, and the intermediate layer are respectively expressed by $C_{Assist}(EML2)$, $C_{Assist}(EML3)$, and $C_{Assist}(IML)$, the following Relational Expression (A) is satisfied:

$$C_{Assist}(IML) > C_{Assist}(EML2) \geq C_{Assist}(EML3) \tag{A}$$

2. The light-emitting element according to claim 1,
wherein the host material is a material having high electron transportability, and the assist dopant material is a material having high hole transportability.

3. The light-emitting element according to claim 2,
wherein, in each of the second and third light-emitting layers and the intermediate layer, when mobility of holes is expressed by $\mu h$ and mobility of electrons is expressed by $\mu e$, in the intermediate layer and the second light-emitting layer, the following Relational Expression (1) is satisfied:

$$0.01 \leq \mu e/\mu h \leq 100 \tag{1}$$

4. The light-emitting element according to claim 3,
wherein, in the third light-emitting layer, the following Relational Expression (2) is satisfied:

$$\mu e/\mu h \geq 100 \tag{2}$$

5. The light-emitting element according to claim 1,
wherein, when the thicknesses of the second and third light-emitting layers are respectively expressed by $T(EML2)$ and $T(EML3)$, the following Relational Expression (B) is satisfied:

$$T(EML2) \leq T(EML3) \tag{B}$$

6. The light-emitting element according to claim 1,
wherein the host material is an acene-based compound.

7. The light-emitting element according to claim 1,
wherein the assist dopant material is an amine-based compound.

8. The light-emitting element according to claim 7,
wherein the amine-based compound is a compound represented by the following Formula (4)

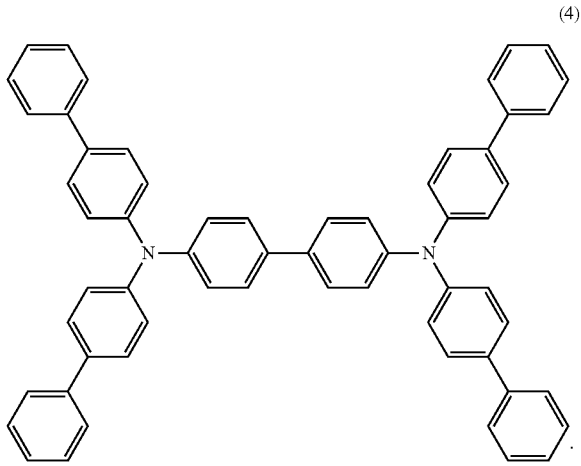 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

(4)

9. The light-emitting element according to claim 1,
wherein the luminescent materials respectively contained in the second light-emitting layer and the third light-emitting layer are the same as each other.

10. The light-emitting element according to claim 1,
wherein the luminescent materials respectively contained in the second light-emitting layer and the third light-emitting layer are different from each other.

11. A light-emitting device, comprising the light-emitting element according to claim 1.

12. A light-emitting device, comprising the light-emitting element according to claim 2.

13. A light-emitting device, comprising the light-emitting element according to claim 3.

14. A light-emitting device, comprising the light-emitting element according to claim 4.

15. A light-emitting device, comprising the light-emitting element according to claim 5.

16. A light-emitting device, comprising the light-emitting element according to claim 6.

17. A light-emitting device, comprising the light-emitting element according to claim 7.

18. A light-emitting device, comprising the light-emitting element according to claim 8.

19. A display device, comprising the light-emitting device according to claim 11.

20. An electronic apparatus, comprising the display device according to claim 19.

* * * * *